United States Patent
Green et al.

(10) Patent No.: US 10,994,438 B2
(45) Date of Patent: May 4, 2021

(54) FLITCH TRACKING

(71) Applicant: USNR, LLC, Woodland, WA (US)

(72) Inventors: Paul W. Green, Parksville (CA); Dwayne Seawai Fujima, Parksville (CA)

(73) Assignee: USNR, LLC, Woodland, WA (US)

( * ) Notice: Subject to any disclaimer, the term of this patent is extended or adjusted under 35 U.S.C. 154(b) by 282 days.

(21) Appl. No.: 15/907,257

(22) Filed: Feb. 27, 2018

(65) Prior Publication Data

US 2018/0243934 A1    Aug. 30, 2018

Related U.S. Application Data

(60) Provisional application No. 62/464,343, filed on Feb. 27, 2017.

(51) Int. Cl.
*B27B 1/00* (2006.01)
*G05B 19/4097* (2006.01)
*B27B 31/06* (2006.01)

(52) U.S. Cl.
CPC .............. *B27B 1/007* (2013.01); *B27B 31/06* (2013.01); *G05B 19/4097* (2013.01); *G05B 2219/35134* (2013.01)

(58) Field of Classification Search
CPC ......... B27B 1/007; B27B 31/06; G06F 30/00; G05B 19/4097; G05B 2219/35134;
(Continued)

(56) References Cited

U.S. PATENT DOCUMENTS 5,884,682 A * 3/1999 Kennedy ............... B27B 1/007
144/242.1
6,756,789 B1    6/2004 Parker
(Continued)

FOREIGN PATENT DOCUMENTS

| WO | WO2016-019177 A1 | 2/2016 |
| WO | WO2016/019177 A1 | 2/2016 |
| WO | WO2018157173 A1 | 8/2018 |

OTHER PUBLICATIONS

Canadian Patent Application No. 2,996,765; Examination Report; dated Sep. 17, 2019.
(Continued)

*Primary Examiner* — Cedric Johnson
(74) *Attorney, Agent, or Firm* — Schwabe Williamson & Wyatt, P.C.

(57) ABSTRACT

In various embodiments, a scanner optimizer system may generate a virtual model of a predicted flitch based on a 3D model of a log/cant and a cut solution for the log/cant. The scanner optimizer system may compare a virtual model of an actual flitch to virtual models of predicted flitches by comparing data points at a fixed elevation relative to one or both faces of the models. Based on the comparisons, the scanner optimizer system may identify the source log from which the actual flitch was cut. In addition, the scanner optimizer system may identify the saw used to cut the actual flitch, and/or other relevant information, and use the additional information to monitor and adjust the saws and other equipment. Embodiments of corresponding apparatuses and methods are also described.

21 Claims, 18 Drawing Sheets

(58) Field of Classification Search
CPC .... G05B 19/41875; G05B 2119/37558; G05B 2119/45144; G05B 2219/45229; G05B 19/4183; B23D 59/008
USPC .......................................................... 703/1
See application file for complete search history.

(56) References Cited

U.S. PATENT DOCUMENTS

| | | | |
|---|---|---|---|
| 8,370,222 B2 | 2/2013 | Barker | |
| 2005/0161118 A1 | 7/2005 | Carman | |
| 2009/0049377 A1 | 2/2009 | Moore | |
| 2011/0213595 A1* | 9/2011 | Ballmer | G05B 19/401 703/1 |
| 2012/0262725 A1* | 10/2012 | Barker | B27B 31/06 356/601 |
| 2013/0199672 A1* | 8/2013 | Barker | B23D 59/008 144/357 |
| 2016/0288354 A1 | 10/2016 | Blomquist | |
| 2016/0325453 A1* | 11/2016 | Middleton | G05B 19/402 |
| 2018/0243934 A1 | 8/2018 | Green | |

OTHER PUBLICATIONS

International Patent Application No. PCT/US2018/020058; International Preliminary Report on Patentability; dated Aug. 27, 2019.
Canadian Patent Application No. 2,996,765; Examination Report; dated Jan. 17, 2020.
International Patent Application No. PCT/US2018/020058; International Search Report and Written Opinion, dated Jun. 4, 218.
European Patent Application No. 18757342.3; European Search Report; dated Dec. 2, 2020.
Canadian Patent Application No. 2,996,765; Examination Report; dated Dec. 14, 2020.

* cited by examiner

FIG 14

FLITCH TRACKING

CROSS-REFERENCE TO RELATED APPLICATIONS

This application claims the benefit of U.S. Provisional Patent Application No. 62/464,343 filed Feb. 27, 2017 and titled "Flitch Tracking," the disclosure of which is hereby incorporated in its entirety.

TECHNICAL FIELD

Embodiments disclosed herein relate to lumber processing, and more specifically to quality and processing control in lumber processing facilities.

BACKGROUND

Lumber mills process logs in a variety of ways to produce lumber. A common strategy is to cut the logs into several pieces, such as flitches and/or cants, which can then be cut into lumber of the desired dimensions. For example, some mills open flat faces along opposite sides of the log and cut one or more flitches from each side of the resulting cant. The flitches are sent to an edger to be cut into side boards. The remaining portion of the two-sided cant is chipped or cut to yield a smaller four-sided cant, which is sent to a gang saw to be cut into center boards. Some of the other options include cutting at least one flitch from each side, cutting multiple flitches from multiple sides, cutting the entire two-sided cant into flitches, or cutting a flitch from one side of the log before rotating the log 90 degrees and cutting a flitch from the next side.

The flitches are dropped onto a queuing deck to be picked up by an unscrambler, which singulates the flitches. The singulated flitches are fed onto a lugged conveyor and conveyed through a scan zone to an edger infeed. The flitches are positioned on the edger infeed for cutting and conveyed into the edger to be cut into boards. The cant is sent to a gang saw to be cut into additional boards.

BRIEF DESCRIPTION OF THE DRAWINGS

Embodiments will be readily understood by the following detailed description in conjunction with the accompanying drawings. Embodiments are illustrated by way of example and not by way of limitation in the figures of the accompanying drawings.

FIGS. 14-17 illustrate examples of user interface screens, all in accordance with various embodiments.

DETAILED DESCRIPTION OF DISCLOSED EMBODIMENTS

Figure 1:
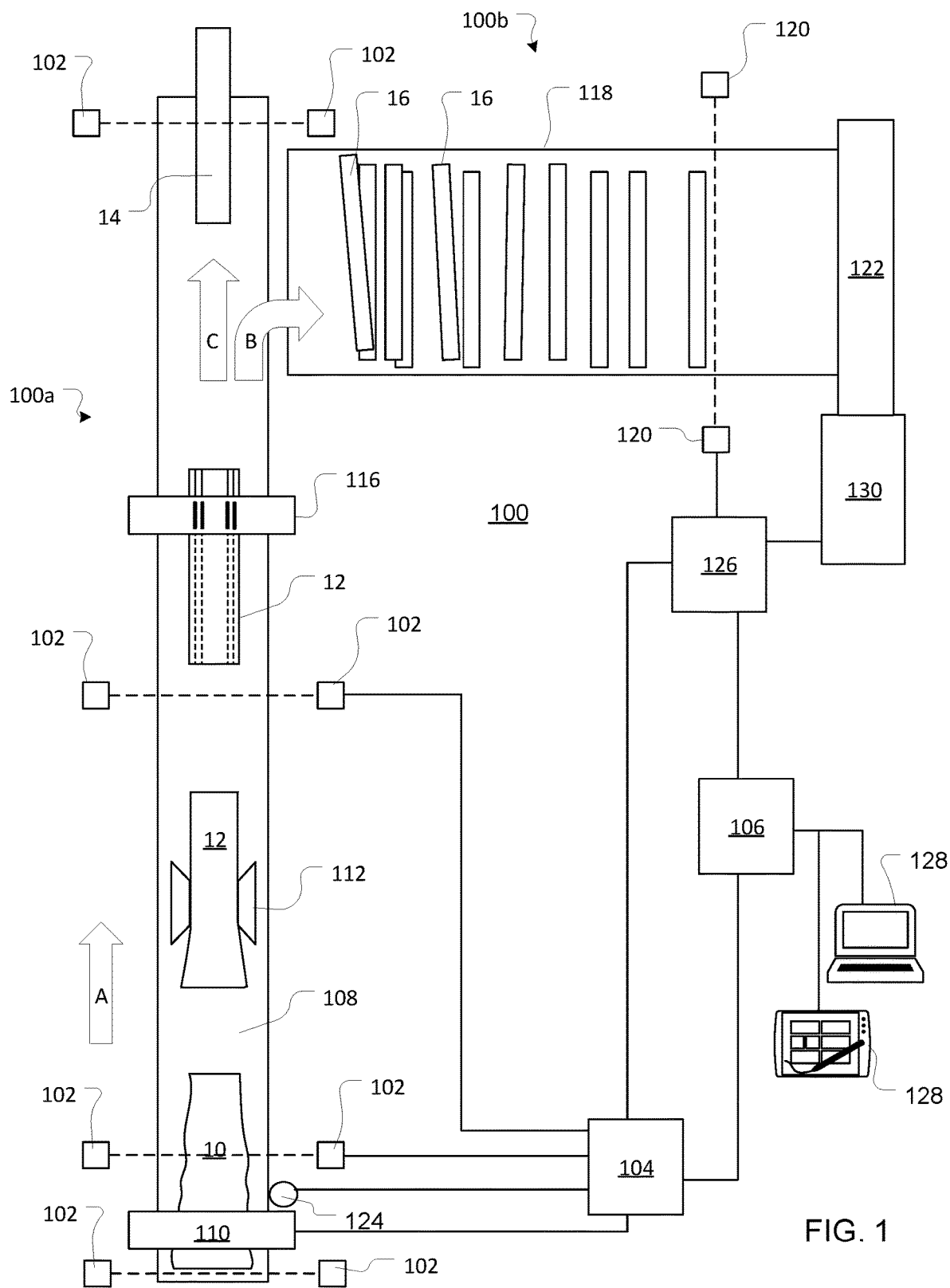
FIG. 1 is a schematic diagram of a lumber processing system.

In the following detailed description, reference is made to the accompanying drawings which form a part hereof, and in which are shown by way of illustration embodiments that may be practiced. It is to be understood that other embodiments may be utilized and structural or logical changes may be made without departing from the scope. Therefore, the following detailed description is not to be taken in a limiting sense, and the scope of embodiments is defined by the appended claims and their equivalents.

Various operations may be described as multiple discrete operations in turn, in a manner that may be helpful in understanding embodiments; however, the order of description should not be construed to imply that these operations are order dependent.

The description may use perspective-based descriptions such as up/down, back/front, and top/bottom. Such descriptions are merely used to facilitate the discussion and are not intended to restrict the application of disclosed embodiments.

The terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other.

For the purposes of the description, a phrase in the form "A/B" or in the form "A and/or B" means (A), (B), or (A and B). For the purposes of the description, a phrase in the form "at least one of A, B, and C" means (A), (B), (C), (A and B), (A and C), (B and C), or (A, B and C). For the purposes of the description, a phrase in the form "(A)B" means (B) or (AB) that is, A is an optional element.

The description may use the terms "embodiment" or "embodiments," which may each refer to one or more of the same or different embodiments. Furthermore, the terms "comprising," "including," "having," and the like, as used with respect to embodiments, are synonymous.

As used herein, a "cant" is a portion of a log that is formed by chipping or sawing along at least one side of the log to form a substantially flat face along the side of the log. As used herein, a "flitch" is a piece of wood that has a pair of machined opposing faces joined by two edges, at least one of which is a wane edge. For example, a flitch may be formed by cutting through a cant lengthwise, generally parallel to a machined face of the cant, to sever the flitch from a remaining portion of the cant.

In exemplary embodiments, a computer system may be endowed with one or more components of the disclosed apparatuses and/or systems, and may be employed to perform one or more methods, as disclosed herein. Functions/processes attributed in the following description to a particular computer system may instead be performed by another computer system, or distributed among two or more computer systems. Likewise, functions/processes attributed to multiple computer systems may be performed by a single computer system.

As flitches are cut from logs/cants, they typically drop onto the queuing deck in the order in which they were sawn. However, the flitches can stack up randomly on the queuing deck and/or be picked up out of order by the unscrambler, which causes them to be out of order when they reach the edger scan zone. As a result, the flitches cannot be matched to their source logs based solely on their order of arrival at the edger. This means that the saw(s) that cut a particular flitch cannot be identified after the flitch has been dropped onto the queuing deck. If the facility is consistently producing some flitches that are too thin or too thick, identifying the problem saw(s) can be very difficult and time-consuming.

In most facilities that use log scanner/optimizers and flitch scanner/optimizers, the flitches are typically scanned at higher resolution than the logs. Therefore, if the flitches can be matched to the saws that cut them, the information generated by the existing flitch scanner can be used to assess the performance of the saws. Embodiments of systems, apparatuses and methods described herein may enable a facility to identify a primary workpiece (e.g., a log or a cant), and the zone or portion thereof, from which a flitch was cut. Such embodiments may further enable the facility to use the data collected by sensors upstream of the edger (e.g., an existing flitch scanner) to identify the saw(s) that cut a particular flitch and monitor the performance of the saws. In some embodiments, the saws and/or other equipment (e.g., sensors, chipper, etc.) may be adjusted based on the performance information.

In addition, some sawmills process logs of different tree species, and the value of a given cut pattern may be different for one species than for another. For example, the most profitable cut pattern for a log of one species may be different than the most profitable cut pattern for another log of identical dimensions, but of a different species. Therefore, some sawmills may sort the logs into batches according to species and process each batch separately. However, the sorting may increase the overall cost of operation and thereby reduce profits. Identifying the wood species of the flitches upstream of the edger may allow the sawmill to cut each flitch according to the most profitable cut pattern for that flitch while processing logs of multiple species.

In various embodiments, a lumber processing system may include a primary breakdown line, a secondary breakdown line, and a scanner optimizer system.

The primary breakdown line may include one or more cutting devices (e.g., chippers, profilers, and/or saws) and a first transport system. The secondary breakdown line may include an edger and/or trimmer and a second transport system. Flitches may be cut from logs along the primary breakdown line and edged into boards along the secondary breakdown line.

The scanner optimizer system may include a first plurality of geometric (e.g., laser profile) sensors arranged to form a first scan zone along the first transport system, a first computer system operatively coupled with the first plurality of sensors, a second plurality of geometric (e.g., laser profile) sensors arranged to form a second scan zone along the second transport system, and a second computer system operatively coupled with the second plurality of sensors. Optionally, the scanner optimizer system may further include a third computer system in communication with the first and second computer systems.

The first computer system and associated sensors may detect the geometric profile of a log, generate a 3D virtual model of the log based on the geometric profile, and determine an optimized cut solution for the log based on the virtual model. Implementing the cut solution may involve chipping or sawing a flat face along the log and cutting longitudinally through the log (now a cant) parallel to the chipped face to release a flitch from the remaining center cant. The optimized cut solution may define predicted cut lines along which the log is to be cut into predicted products, including a predicted flitch. In some embodiments the first computer system may determine a saw set (i.e., instructions for positioning the corresponding chipper/saw(s) to cut the log/cant according to the cut solution), in which case the saw set may be considered part of the optimized cut solution. Optionally, the predicted cut lines may be defined by the saw set. The first computer system and/or associated sensors may send the 3D virtual model of the log and the optimized cut solution to the third computer system, and the third computer system may use the information to generate a 3D virtual model of the predicted flitch.

The log may be cut according to the optimized cut pattern to obtain the flitch. The second computer system and associated sensors may detect the geometric profile of the actual flitch upstream of the edger, generate a 3D virtual model of the actual flitch based at least on the geometric profile, and determine an optimized cut solution for the flitch based at least on the 3D virtual model. The second computer system and/or associated sensors may send the 3D virtual model of the actual flitch to the third computer system.

In various embodiments, some or all of the 3D virtual models may be geometric surface models of the logs/flitches. For example, the log or flitch may be modeled as a set of cross sections at fixed intervals along the length (Z axis) of the log or flitch, with each of the cross sections represented by a corresponding set of data points. The data points may be two-dimensional points (X and Y) that represent the outer surface at that Z location, such that the data points collectively define the shape of the outer surface of the log or flitch.

In some embodiments, a log record may be generated for each log and placed in a queue, and each computer system may associate the data it generates/receives with the corresponding log record. A log record may include data such as the virtual model of the log, the corresponding cut solution, 2D/3D virtual models of predicted flitches, and the corresponding cut zones of the log. Other relevant information (e.g., log/tree species, ID number of the log/flitch, location/size/type of defects, length, diameter, sweep, and/or other characteristics) may also be associated with corresponding log records in the queue. In some embodiments, a log record may be created by the first computer system for each log (e.g., in response to receiving the next set of scan data from the first scan zone or sub-zone thereof).

In some embodiments, the third computer system may be configured to generate 2D virtual models of the predicted flitches and the actual flitches based on the 3D virtual models of the predicted and actual flitches. Optionally, some or all of the 2D virtual models may be 'topographical' models. A topographical model may represent the outer contour of the actual or predicted flitch within a plane that is parallel to, and at a known distance from, one or both of the faces defined in the 3D virtual model. For example, if the 3D virtual model includes a plurality of data points that collectively define the outer shape of a flitch, the corresponding topographical model may be the subset of those data points that lie within a reference plane at a known distance from one or both faces (e.g., equidistant between the faces). Alternatively, some or all of the data points of the topographical model may be extrapolated from the data points of the 3D virtual model (e.g., if few or none of the data points of the 3D model are within the desired reference plane). The location of the reference plane relative to the face(s) may be constant, such that each topographical model represents an outer contour at the same elevation.

The third computer system may compare each 2D virtual model of an actual flitch to 2D virtual models of predicted flitches associated with log records in the queue, and identify a match based on the comparisons. The third computer system may record the match in the respective log record to identify the log and zone thereof from which the flitch was cut.

In some embodiments, the third computer system and/or other computer system(s) may be configured to analyze the model and/or match data to obtain information about predicted and actual outcomes of log processing. The information may be used to evaluate the positioning and performance of the cutting devices, scanners, and/or other equipment. For example, in some embodiments the information may be used to assess the calibration of cutting devices or sensors, identify positioning or cutting errors such as misalignments or saw snaking, and identify the source of the error.

In various embodiments, a conventional lumber processing system may be upgraded by programming one or more of the system's existing scanner optimizer systems to perform methods described herein, and/or by adding additional computers/sensors programmed to perform the methods. For example, an existing lumber processing system may include an existing log optimizer and an existing edger optimizer programmed to perform most or all of the operations attributed herein to the first and second computers, and the existing system may be modified by adding a third computer system programmed to perform the remaining operations, and/or by programming one or more of the existing computer systems to perform the remaining operations.

Turning now to the figures, a schematic diagram of a lumber processing system 100 is illustrated by way of example in FIG. 1, in accordance with various embodiments. Lumber processing system 100 may include a primary breakdown line 100a and a secondary breakdown line 100b.

The primary breakdown line 100a may include a log turner 110, a chipper 112, saws 116, and a transport system 108 configured to convey logs 10 and cants 12 (and optionally, center cants 14) along a path of flow that extends through the log turner and the cutting devices. Alternatively, the primary breakdown line may have a saw center (e.g., one or more band saws or paired circular saws) upstream of saws 116 instead of a chipper.

Transport system 108 may include any suitable number and combination of transfers, conveyors, and/or positioning devices (e.g., feed rolls, positioning pins/rolls, hold down rolls, lifts, skids/pans, ramps, etc.). In some embodiments transport system 108 may include a series of conveyors that collectively define the path of flow through the log turner, chipper, and saw. For example, the transport system may include a flighted chain conveyor that transports logs to the log turner, a sharp chain conveyor that transports the logs into/through chipper 112, and another conveyor and/or paired feed rolls that feed the resulting cants into saws 116. In some embodiments portions of the transport system such as feed rolls and conveyors may be selectively operable to skew and/or slew the logs or cants as they are being fed into or through a corresponding machine center. Alternatively, the feed rolls and/or conveyors may be fixed in position and the machine centers or parts thereof (e.g., saws, chip heads) may be selectively repositionable. As another alternative, a conveyor and a corresponding machine center may be selectively repositionable. The number and arrangement of conveyors, feed/positioning rolls, hold down rolls, and other such components may vary among embodiments.

Log turner 110, chipper 112, and saws 116 may be conventional devices of any suitable number and configuration. For example, log turner 110 may be a roll-type, ring-type, sharp chain-type, rotary, knuckle, or other type of log turner. Chipper 112 may have one or more conical, drum-style, or other type of chip heads. Optionally, chipper 112 may be a chipper-canter (e.g., a vee chipper-canter, horizontal chipper-canter, or vertical chipper-canter). Saws 116 may include one or more band saws and/or circular saws. For example, saws 116 may be a quad bandmill or a quad arbor saw.

Optionally, the primary breakdown line 100a may further include additional handling or positioning devices. Examples of such devices include (but are not limited to) log loaders, debarkers, log kickers, cant turners/kickers, positioning/feed rolls, hold down rolls, and lift pans/skids. The number, arrangement, type, and configuration of such devices may vary among embodiments.

In various embodiments, the secondary breakdown line 100b may include an edger infeed 122, an edger 130, and a transport system 118 configured to convey flitches from transport system 108 to edger infeed 122.

Again, transport system 118 may be a conventional conveyor/transfer system. Transport system 118 may include any suitable number and type(s) of transfers, conveyors, positioning devices, and the like. Optionally, transport system 118 may include several transfers/conveyors arranged in sequence. For example, in some embodiments transport system 118 may include a queuing deck, an unscrambler downstream of the queuing deck, and a lugged chain conveyor between the unscrambler and the edger infeed. Optionally, a lug loader and/or lumber indexing devices such as duckers, pins/stops, or other such devices may be provided between the unscrambler and the lugged chain conveyor to deal the flitches into corresponding lug spaces.

Edger infeed 122 may be a conventional edger infeed. Edger infeed 122 may include one or more conveyors operable to move the flitches into the edger. Optionally, edger infeed 122 may further include hold-down rolls above the conveyor(s). In some embodiments transport system 118 and/or edger infeed 122 may further include a positioning system selectively operable to place the flitches onto the edger infeed 122 in desired positions for cutting. For example, the positioning system may include pins or conveyors that are independently operable to position the flitches onto the ramps, and the ramps may be operable to lower the repositioned flitches onto the edger infeed 122. In various embodiments, transport system 118 and/or edger infeed 122 may further include various other devices such as ending rolls, board/flitch turners, wane sensors, duckers/stops, drop-out gates, and the like.

Edger 130 may be a straight-sawing, curve-sawing, gang, or other type of edger. Regardless, edger 130 may be a conventional edger, with one or more saws operable to cut flitches into boards. Optionally, edger 130 may also include side chippers, a reman head, and/or other features in any suitable number, type, and arrangement.

The scanner optimizer system may include a first group of sensors 102 and a second group of sensors 120 arranged to form corresponding scan zones along the primary and secondary breakdown lines, respectively.

Sensors 102 may be arranged to form a first scan zone along transport system 108. In some embodiments, the first scan zone may be located upstream of the log turner 110. In other embodiments, sensors 102 may be arranged to form the first scan zone between the chipper 112 and the saws 116. In still other embodiments, the first scan zone may include multiple sub-zones formed by corresponding groups of sensors 102. For example, as illustrated in FIG. 1, groups of sensors 102 may be arranged to form corresponding sub-zones upstream and/or downstream of the log turner 110, between the chipper 112 and saws 116, and downstream of saws 116. The location and number of sub-zones may vary among embodiments. Optionally, sensors 102 may be arranged at intervals and used to scan corresponding portions of the workpiece to thereby increase the speed at which scan data is captured from the primary workpiece. Alternatively, sub-zones may be arranged at different locations to scan primary workpieces at different phases of processing (e.g., before rotation, after rotation but prior to chipping, after chipping but prior to sawing, and/or after sawing).

Sensors 120 may be arranged to form a second scan zone along transport system 118 and/or edger infeed 122, upstream of the edger 130. Optionally, groups of sensors 120 may be positioned to form multiple sub-zones. The sensors 120 may be arranged to scan flitches traveling in a lineal orientation or in a transverse orientation.

The scanner optimizer system may further include one or more computer systems operatively coupled with the sensors 102 and 120. Each computer system may include one or more personal computers and/or programmable logic controllers, in any suitable number and combination.

Referring again to FIG. 1, in some embodiments the scanner optimizer system may include first computer system 104 operatively coupled with sensors 102, and second computer system 126 operatively coupled with sensors 120. Optionally, computer system 104 and/or 126 may be operatively coupled with a third computer system 106. Any or all of the computer systems may be operatively coupled with one or more laptops, tablets, netbooks, smartphones, or other portable electronic devices used within the facility to monitor operations therein.

In some embodiments the scanner optimizer system may further include one or more position indicator devices 124 for use to determine the positions and/or travel speeds of workpieces on transport systems 108/118. Examples of position indicator devices include, but are not limited to, encoders (e.g., coupled with corresponding conveyors), photo-eyes, overhead cameras, and the like. The number, type, and placement of position indicator devices may vary among embodiments. Position indicator device(s) may be used by the scanner optimizer system to coordinate operations of the sensors, conveyor systems, cutting devices and other equipment, and/or data transfer among computers or computer systems performing the methods described herein.

In various embodiments, sensors 102 and 120 may be, or may include, laser profile sensors. Examples of suitable laser profile sensors include the USNR Smart TriCam sensor with integral DSP processor frame grabber (e.g., for scanning flitches in a transverse orientation) and the USNR LPL or LPLe sensor (e.g., for scanning flitches in a lineal orientation). However, the sensors 102 and 120 may be any sensors suitable for measuring the 3D profile of a log, a cant, or a flitch. Preferably, the sensors are configured to obtain surface measurements, filter the obtained data, and convert the obtained data to dimension (X-Y) coordinates.

In operation, a log may be conveyed on first transport system 108 in a flow direction. As the log passes through the scan zone or sub-zones thereof, the log may be scanned by the corresponding sensors 102 to measure the three-dimensional profile of the log. Based on the scan data, the first computer system may generate a 3D model of the log and an optimized cut solution for the log. The first computer system may also generate instructions for the log turner 110, chipper 112, and saws 116 to position the log, chip the log into a cant, and cut a flitch from the cant, respectively, according to the optimized cut solution. The flitch may be diverted to the transport system 118, which may move the flitch in another flow direction toward edger infeed 122 while the remaining cant 116 continues along the primary breakdown line. (Typically, the remaining cant is cut into boards by a gangsaw downstream of saws 116 in accordance with the optimized cut solution.) The flitches 16 may be singulated along the transport system 118 (e.g., by an unscrambler) before passing individually through the second scan zone to be scanned by the sensors 120 in the second scan zone. The second computer system 126 may generate a 3D model of each flitch based on the corresponding scan data. The third computer system 106 may use the data generated by the first and second computer systems to match the flitches to the logs/cants from which they were cut, as described in further detail below.

Figure 2:
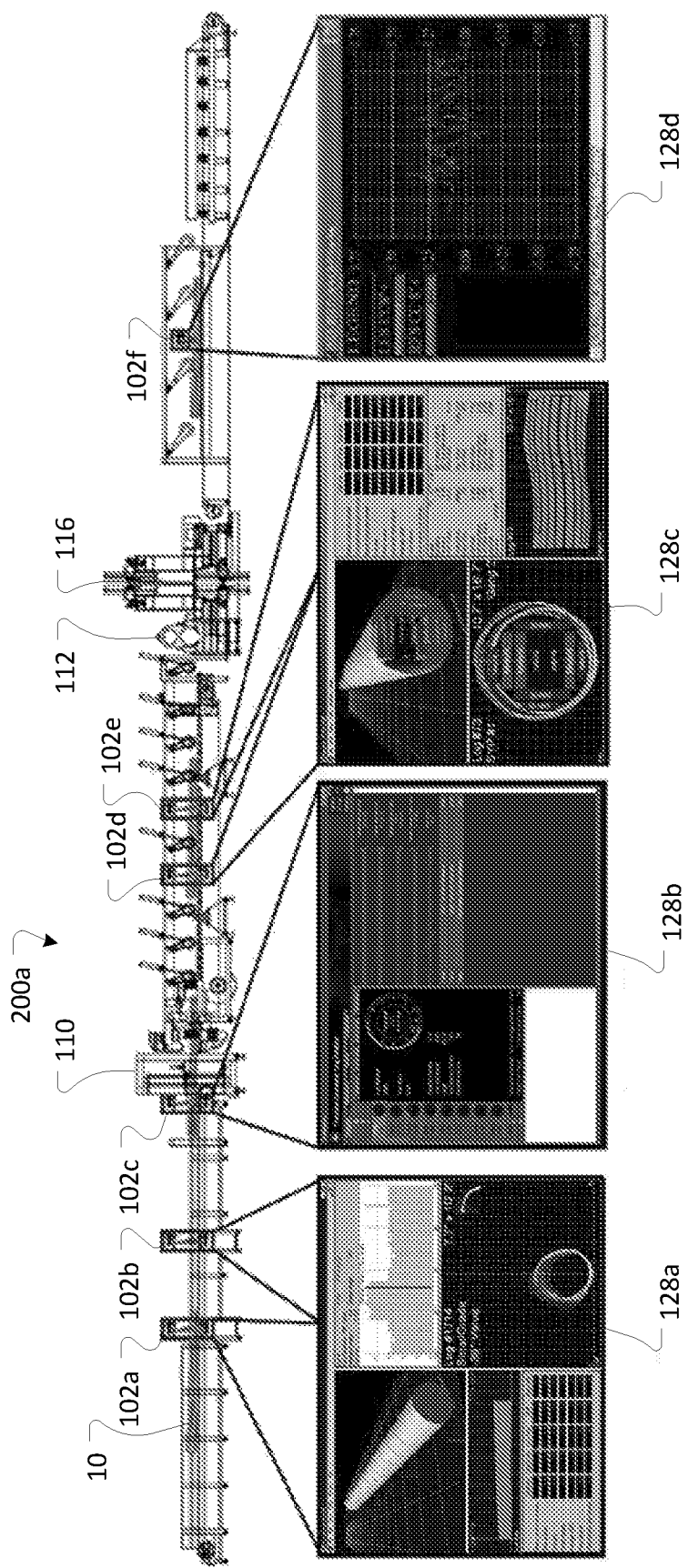
FIG. 2 is a schematic side elevational view of a primary breakdown line and corresponding operations.
Figure 3A:
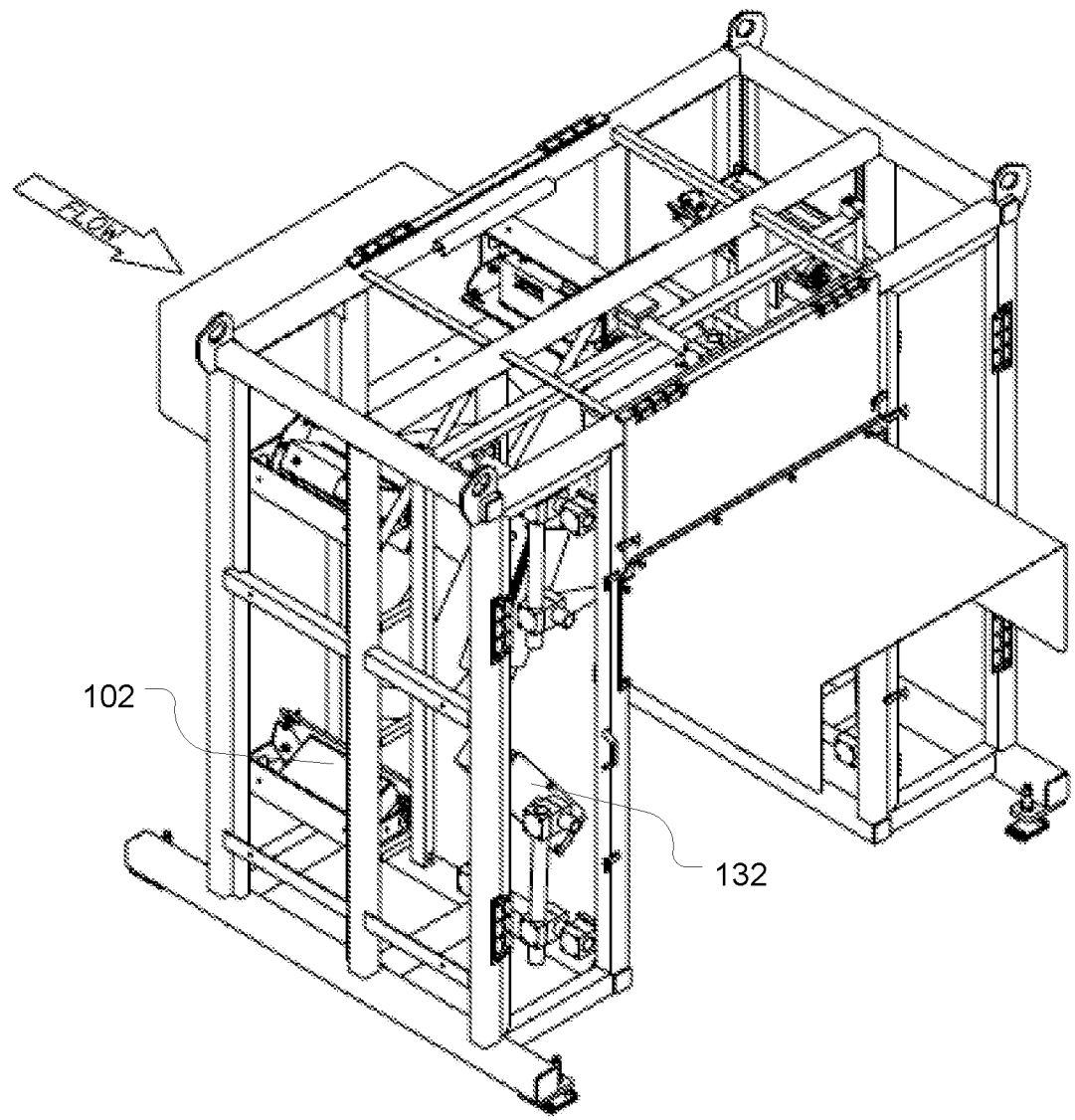
FIGS. 3A-3E illustrate examples of sensor arrangements for a first scan zone, or sub-zones thereof, along a primary breakdown line.
Figure 3B:
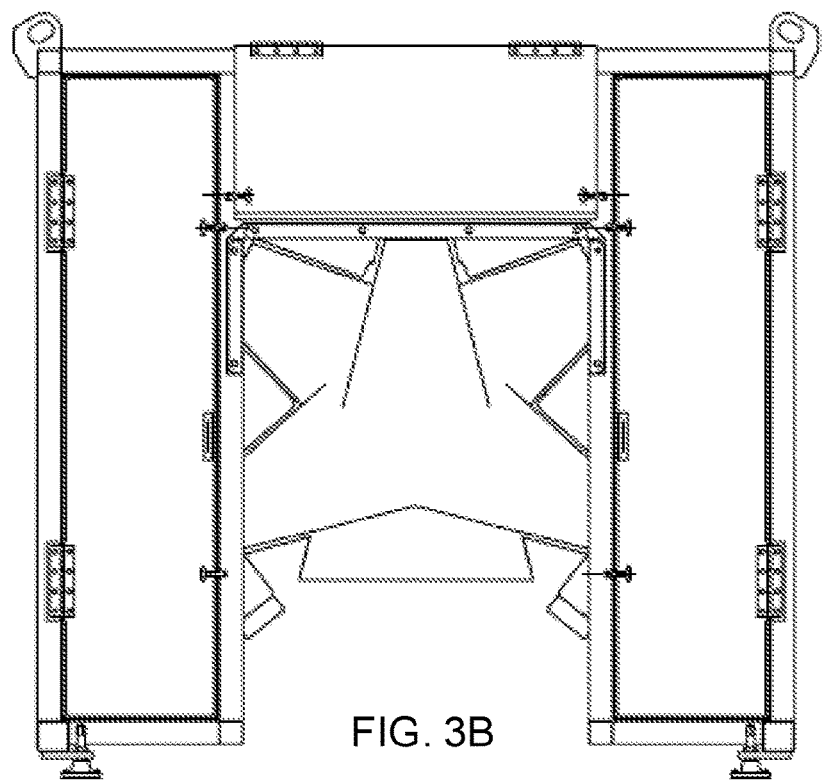
Figure 3C:
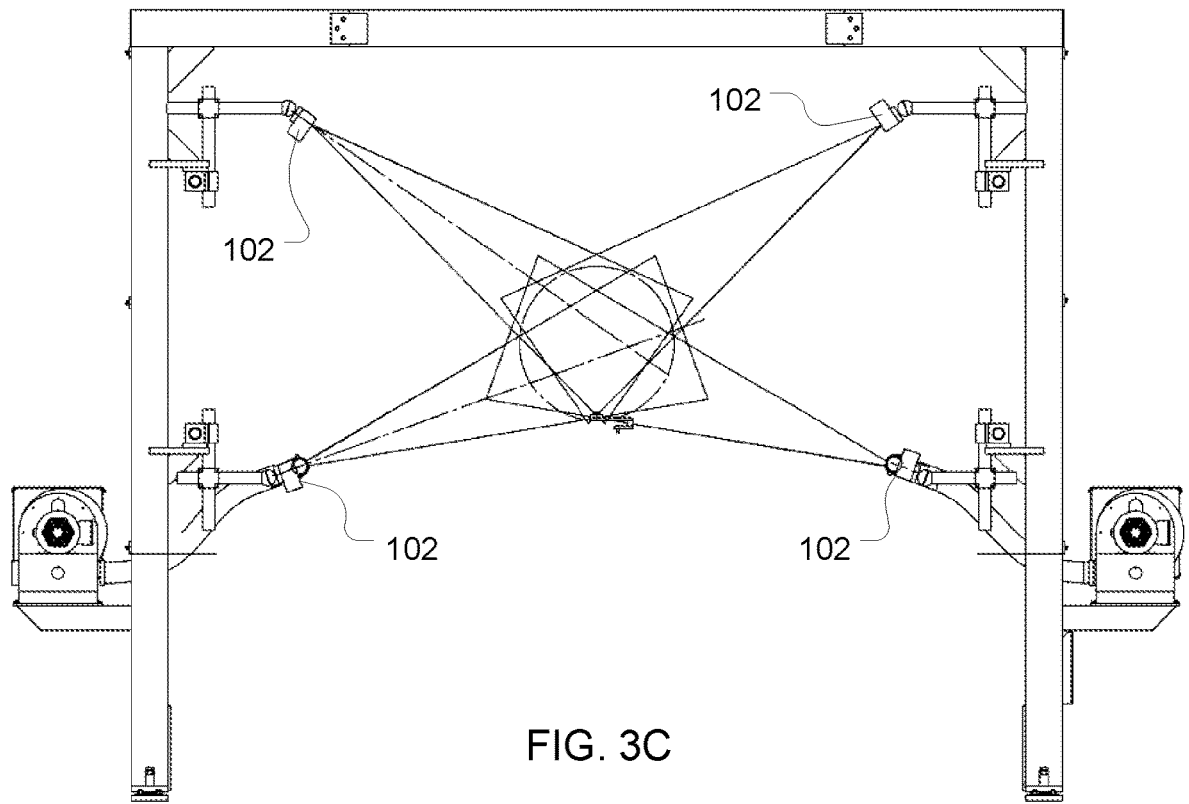
Figure 3D:
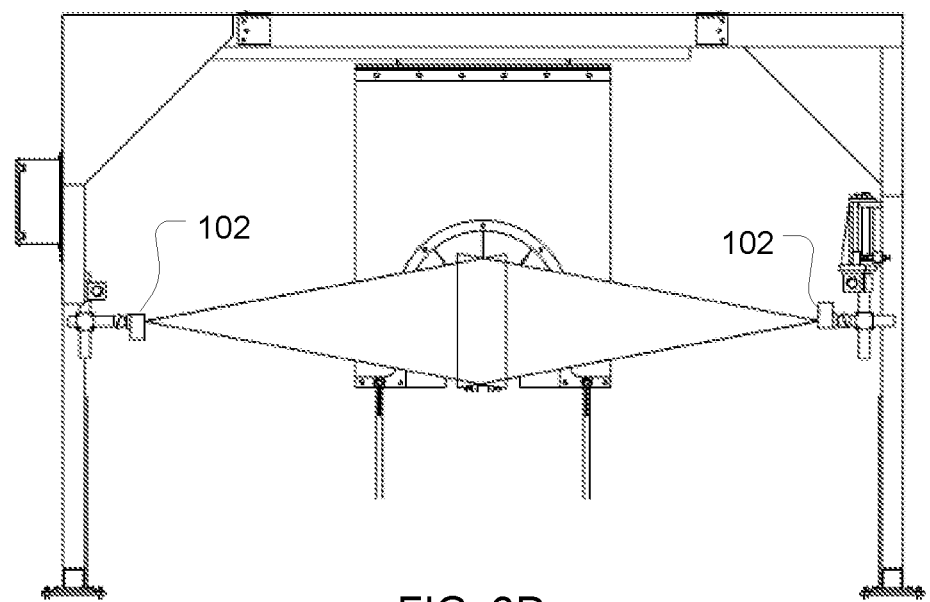
Figure 3E:
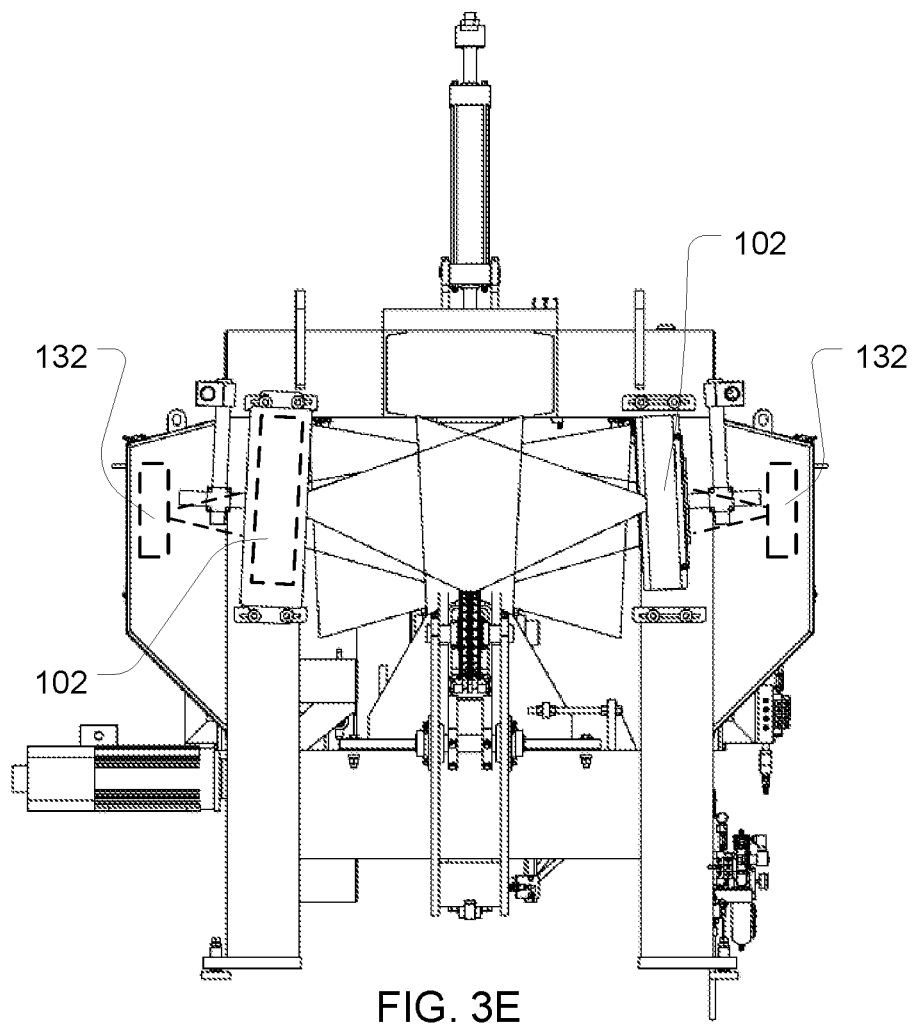

FIG. 2 illustrates a schematic side elevational view of a primary breakdown line 200a and operations of a corresponding computer system, and FIGS. 3A-3E illustrate corresponding arrangements of sensors 102 and/or other sensors, all in accordance with various embodiments. In the embodiment shown in FIG. 2, the first scan zone includes multiple sub-zones formed by corresponding groups of sensors 102. The first two sub-zones are formed by sensors 102a and 102b, respectively, upstream of the log turner 110. The third sub-zone is formed by sensors 102c proximal to the log turner 110 (e.g., at or adjacent to the upstream end or downstream end of the log turner). The fourth and fifth sub-zones are formed by sensors 102d and 102e, respectively, between the log turner 110 and the chipper 112. A sixth sub-zone is formed by sensors 102f downstream of saws 116. This configuration is provided by way of example and is not intended to be limiting. Again, the number and arrangements of sensors and scan zones along the primary breakdown line may vary among embodiments.

In this example, the log may be scanned by sensors 102a and 102b while the log is upstream of the log turner 110, scanned by sensors 102c while being turned by the log turner, and scanned by sensors 102d and 102e while traveling from the log turner to the chipper 112. After the flitch is sawn from the cant by saws 116, the remaining center cant may be scanned (as a cant 14) by sensors 102f while traveling toward another machine center, such as a gang saw. Optionally, an additional sub-zone may be provided between the chipper 112 and the saws 116 to scan the cant 12, or to scan the chipped faces of the cant 12, prior to sawing (see e.g., FIG. 1).

Sensors 102a-102f may be operatively coupled with a first computer system (e.g., computer system 104, FIG. 1). As a log 10 is conveyed along the primary breakdown line, the first computer system may receive scan data from the sensors 102 and analyze the scan data. The first computer system may be configured to generate a 3D model of the log based on data received from at least some of the sensors 102. Optionally, the first computer system may also be configured to determine an optimized cut solution for the log based at least on the 3D model of the log. In some embodiments the first computer system may also be configured to determine an optimized position for the log (e.g., rotational position, skew angle, and/or offset). For example, the first computer system may determine whether the sweep of the log exceeds a predetermined threshold; if so, the horns-down orientation may be deemed the optimized position, and if not, the first computer system may assess potential cut patterns in a number of positions and select the position associated with the greatest value of cut products as the optimized position.

In the configuration shown in FIG. 2, the first computer system may use scan data from the sensors 102a and 102b, and/or from other scanners upstream of sensors 102a, to generate a 3D virtual model of the log and determine an optimized rotational position for the log. Optionally the first computer system may display the 3D virtual model and related information via a user interface, such as a display (e.g., user interface 128a). The first computer system may use data from sensors 102c to monitor the rotation of the log by the log turner and/or to send instructions to the log turner to correct the position of the log during/after the turn. Optionally the first computer system may display the log position/rotation in progress via a user interface, such as a display (e.g., user interface 128b). The first computer system may use the data from sensors 102d and 102e to determine an optimized cut solution for the log. Optionally the first computer system may display the optimized cut solution via a user interface, such as a display (e.g., user interface 128c).

In some embodiments, data from sensors 102f may be used by one or more computer systems to monitor the performance of the primary breakdown line or parts thereof (e.g., saws 116), and/or to predict maintenance requirements. For example, the third computer system may use the scan data from the sensors 102f to determine geometric characteristics of the center cant 14 (e.g., face size, face offset, cant centerline, cant width, and/or cant skew) and compare the determined characteristics to corresponding characteristics of the predicted center cant, as defined by the cut solution for the corresponding log. Optionally, the corresponding computer system may display performance and/or maintenance determinations via a user interface (e.g., user interface 128d). Likewise, if sensors 102 are arranged to form a sub-zone between the chipper 112 and the saws 116, the scan data from those sensors may be used by one or more computer systems to monitor the performance of the chipper by comparing geometric characteristics of the predicted cant and the actual cant. In either case, the scanner optimizer system may use the data to generate a 3D virtual model of the cant or adjust the 3D virtual model of the log and/or cut solution.

The number and arrangement of sensors 102 may vary among embodiments. In some embodiments the first scan zone, or a sub-zone thereof, may include four or five sensors 102 arranged around the path of flow, or two sensors 102 arranged above and below, or on opposite sides of, the path of flow. In the example shown in FIG. 2, each of the first five sub-zones includes four or five sensors 102 arranged around the path of flow (see e.g., FIGS. 3A-3C), and the sixth sub-zone includes two sensors 102 arranged on opposite sides of the path of flow (see e.g., FIG. 3D, 3E). Again, other embodiments may have only a single scan zone, or 2-5 sub-zones, or more than six sub-zones, along the primary breakdown line. Optionally, the first scan zone and/or one or more sub-zone(s) thereof may include one or more additional sensors 132 (FIGS. 3A, 3E), which may be color vision cameras, grain angle sensors, x-ray sensors, ultrasound sensors, and/or any other type of sensor.

Figure 4A:
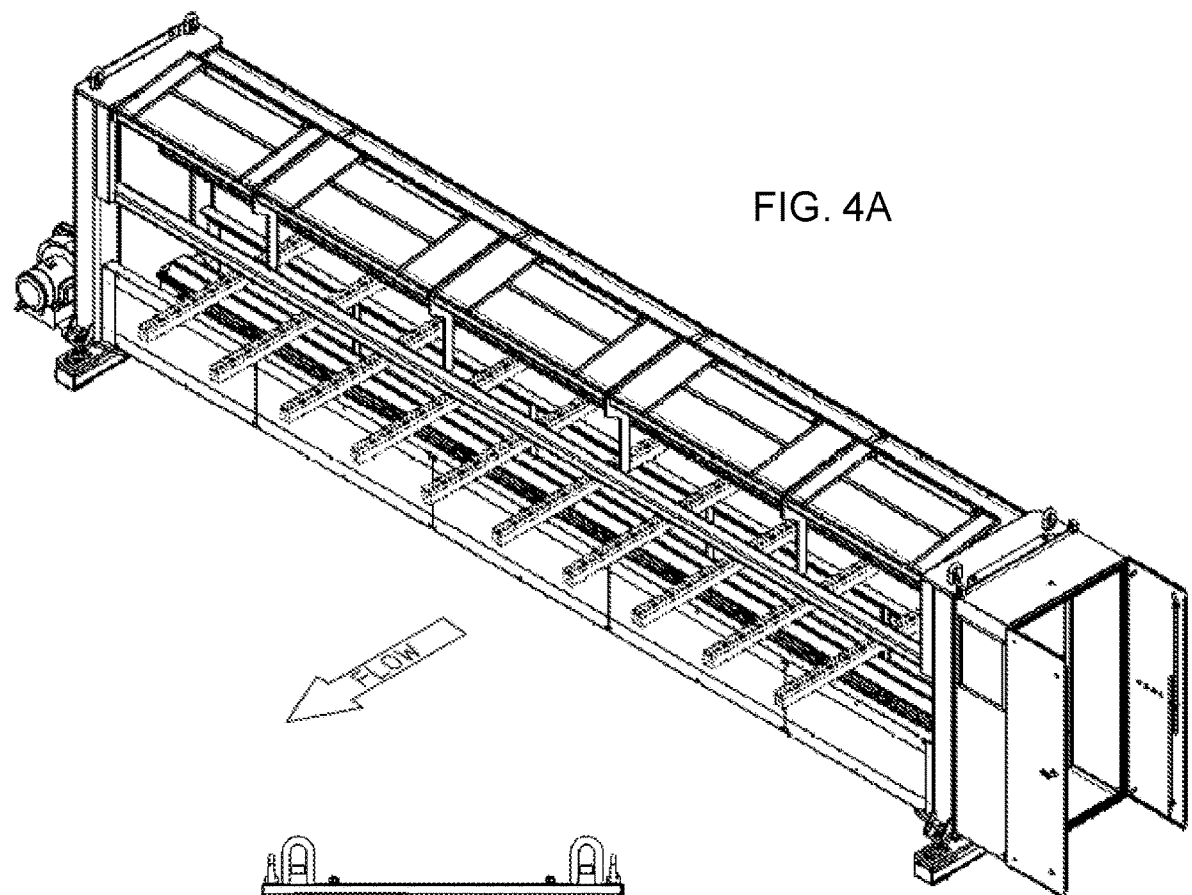
FIGS. 4A-4B illustrate examples of sensor arrangements for a second scan zone, or subzones thereof, along a secondary breakdown line.
Figure 4B:
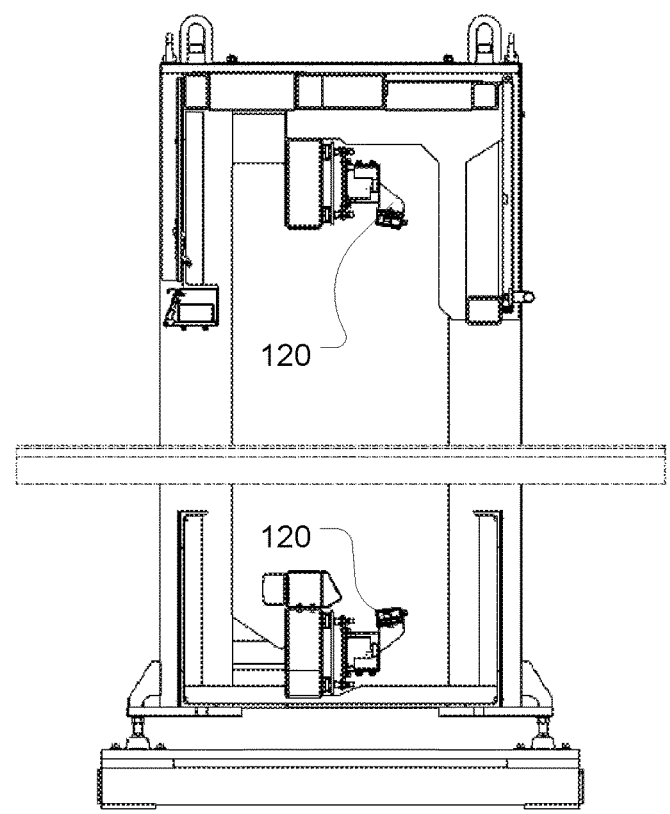

Along the secondary breakdown line, sensors 120 may be arranged above, below, or above and below the path of flow to form a second scan zone. Sensors 120 may be provided in any suitable number, arrangement, and orientation. If the sensors 120 are arranged for transverse scanning, sensors 120 may be spaced apart across the direction of flow (e.g., over and/or under the path of flow). FIGS. 4A-B illustrate a perspective view and a side elevational section view, respectively, of a scanner frame with sensors 120 arranged to scan flitches that are traveling in a transverse orientation. If the sensors 120 are arranged for lineal scanning, a single sensor 120 may be provided over or under a lineal conveyor (e.g., edger infeed 122), or multiple sensors 120 may be spaced apart in the direction of flow and/or around the lineal conveyor. Optionally, one or more of the sensors 120 may be set at angles such that each of the angled sensors 120 can scan two corresponding surfaces of the flitch (e.g., a face and an edge). In some embodiments two or more groups of sensors 120 may be positioned along the lineal conveyor at corresponding locations along the conveyor to collectively scan the flitch. In some embodiments sensors 120 may be arranged for transverse scanning along transport system 118 and other sensor(s) 120 may be arranged for lineal scanning along edger infeed 122.

The first and second computer systems 104 and 126 may be configured to process data received from some or all of the corresponding sensors 102 and 120, respectively. The first and second computer systems may be in communication with a third computer system 106, which may be configured to use data received from the first and second computer systems to match the flitches to their source logs or cants. Optionally, in some embodiments the first computer system 104 may be a conventional log optimizer system, and the second computer system 126 may be a conventional edger optimizer system. The first computer system may be configured to generate a 3D model of a log and an optimized cut solution for the log based on scan data from the sensors 102, and the second computer system may be configured to generate a 3D model of a flitch based on scan data from the sensors 120. The third computer system may be configured to generate a model of a predicted flitch based on the 3D model of the log and the cut solution for that log, and to compare models of actual flitches to models of predicted flitches to thereby identify the log/cant (and optionally, the position within the log/cant) from which the flitch was cut.

In some embodiments, the third computer system 106 may be configured to display visual representations of the comparisons via a user interface (e.g., a user interface 128), such as a display. Optionally, third computer system 106 may also be configured to track the matches as a queue of log solutions and to display various parameters relevant to chipper/saw performance, such as the statistic thickness variance and within board deviation over a range of matches for each cutting device combination.

Figure 5:
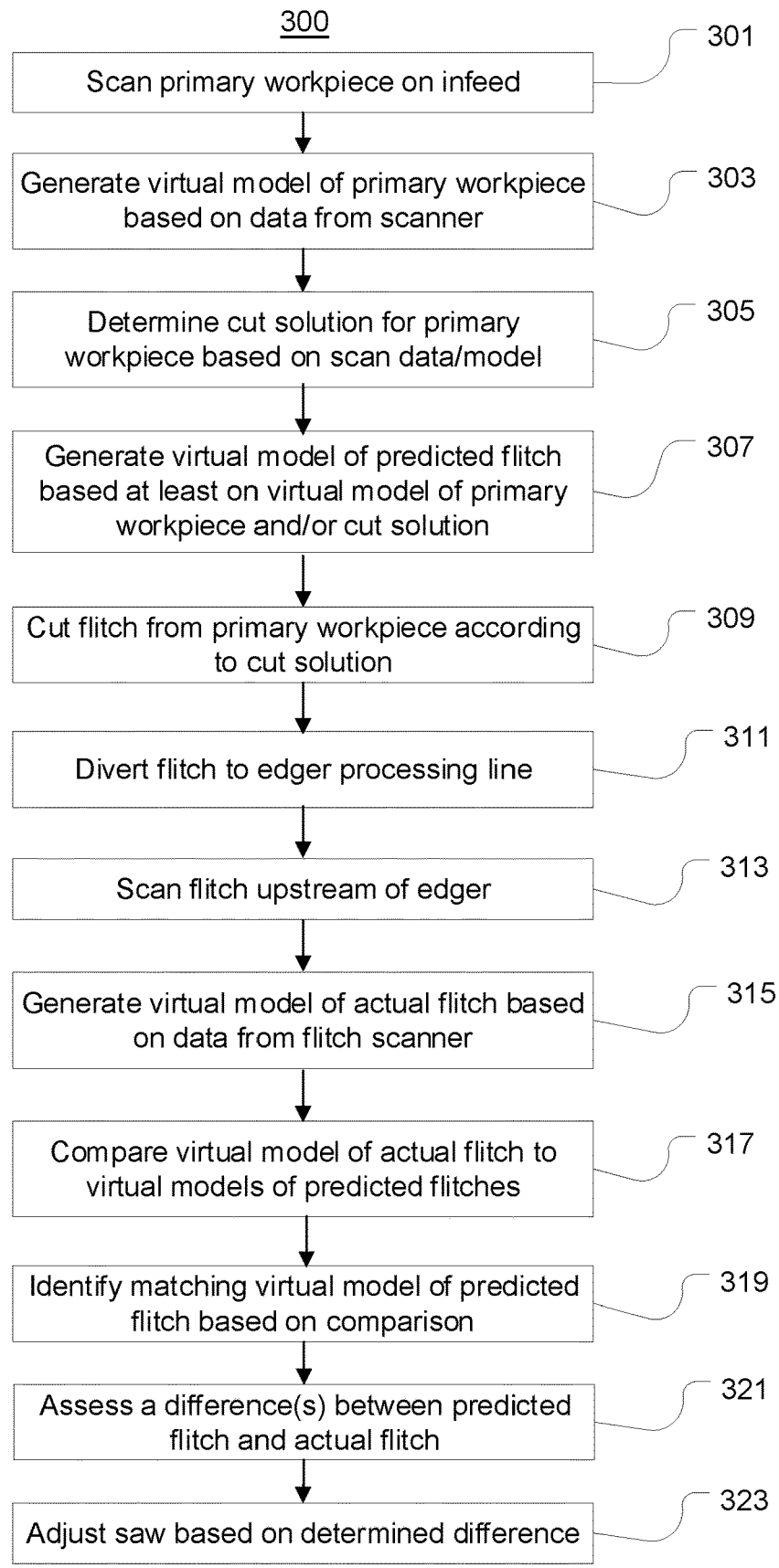
FIG. 5 is a flow diagram of a method of matching flitches to a source log/cant.

FIG. 5 illustrates a process flow for a method 300 of matching flitches to a source primary workpiece, such as a log or a cant, with some operations shown in further detail in FIGS. 6-10. While the blocks are shown in a particular order by way of example, it is to be understood that in various embodiments the corresponding actions/processes may be performed in any order and/or any suitable number of times. Further, one or more of the blocks may be omitted in some embodiments. Therefore, the order and number of actions/processes is not intended to be limiting.

At block 301, a primary workpiece on transport system 108 may be scanned by geometric sensors 102. In some embodiments, the primary workpiece may be a log (e.g., log 10), and the log may be scanned by sensors 102 upstream of the chipper. Optionally, the log may be scanned in multiple sub-zones upstream of the chipper (e.g., upstream of a log turner and between the log turner and the chipper). In other embodiments, the primary workpiece may be a cant (e.g., cant 12), and the cant may be scanned by sensors 102 upstream of saws 116. In still other embodiments, both the log and the corresponding cant may be scanned. Optionally, a remaining center cant (e.g., cant 16) may be scanned downstream of the saws 116. Regardless, sensors 102 may be configured to measure the outer shape of the log and to generate corresponding scan data in the form of dimension coordinates (x, y) along the length (z axis) of the log. In other embodiments, block 301 may be omitted (e.g., the primary workpiece may be scanned upstream of transport system 108 or outside of the facility, and the scan data may be transmitted to the scanner optimizer system).

At block 303, the scanner optimizer system may generate a 3D virtual model of the primary workpiece based on the scan data. In some embodiments block 303 may proceed while the log 10, cant 12, and/or cant 16 is transported/processed along the primary breakdown line. An example of a process flow for generating the 3D virtual model of the log is shown in FIG. 6.

Figure 6:
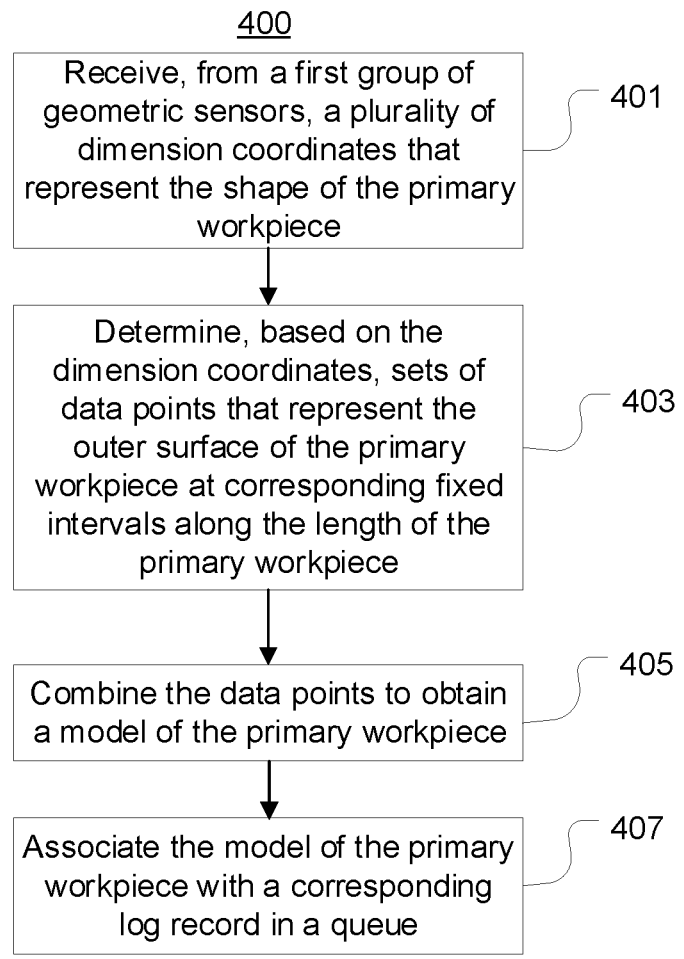
FIG. 6 is a flow diagram of a method of generating a virtual model of a log.

Referring now to FIG. 6, the first computer system 104 may receive the scan data from the scanners at block 401. At block 403, based on the received dimension coordinates, the first computer may determine sets of data points (x, y coordinates) that represent the outer surface of the primary workpiece at corresponding fixed intervals (e.g., every 4 inches) along the length (z-axis) of the primary workpiece. At block 405, the first computer system 104 may combine the sets of data points to obtain the 3D virtual model of the primary workpiece. Optionally, at block 407 the first computer system 104 may associate the 3D virtual model of the primary workpiece with a corresponding log record in a queue. In some embodiments the first computer system 104 may also create the log record. Alternatively, another computer system (e.g., third computer system 106) may create the log record.

The method or process by which the computer system generates the 3D virtual model of the primary workpiece may vary among embodiments. In some embodiments, the 3D virtual model may be generated by the computer system as an input for determining an optimized cut solution for the primary workpiece.

Referring again to FIG. 5, at block 305 the first computer system 104 may determine an optimized cut solution for the primary workpiece based on the scan data and/or the 3D model. The optimized cut solution may define the predicted products to be cut from the primary workpiece, which may include at least one predicted flitch, and the predicted cut line(s) along which the primary workpiece is to be cut to obtain the predicted products. In some embodiments the first computer system may determine a saw set for positioning the saw(s) that will be used to cut the flitch, and the saw set may be considered part of the optimized cut solution. Optionally, the predicted cut lines may be defined by the saw set. Alternatively, the predicted cut lines may be represented by lines or planes incorporated into, or displayed relative to, the 3D model of the primary workpiece (see e.g., FIG. 2, user interface 128c).

The optimized cut solution may be determined in any suitable manner. In some embodiments, the primary workpiece may be a log, and the first computer system may use the 3D virtual model of the log to determine a desired rotation angle (and optionally a desired skew/offset) for the log. The first computer system may determine the desired rotation (and optionally the desired skew/offset) by simulating a variety of possible orientations for the log and selecting a 'best' orientation based on any one or more of a variety of factors, such as predicted stability on a downstream conveyor (e.g., a sharp chain conveyor), a detected crack or other defect, and/or potential cut solutions that could be implemented. For example, the first computer system might simulate multiple orientations of the 3D virtual model of the log, assess the likely stability of the log on a sharp chain in each of the orientations, determine the potential cut solutions for each of the orientations deemed likely to be sufficiently stable on the sharp chain, and select one of those cut solutions as the 'optimized cut solution' based on the monetary value of the predicted products, predicted through-put speed, and/or products needed to fill an order. In other embodiments, the first computer system may determine the optimized cut solution without assessing predicted log stability, or based on a different combination of factors.

In other embodiments, the primary workpiece may be a cant, and the optimized cut solution may be determined for the cant in the same or similar manner as for a log. In still other embodiments the primary workpiece may be a cant, and the optimized cut solution may be determined instead (e.g., as described above) for the source log that was cut/chipped to form the cant.

The first computer system may communicate the optimized cut solution to a programmable logic controller (PLC) or other control device to position the cutting devices for cutting. Again, in some embodiments the first computer system may generate a saw set that defines the chipper/saw position(s) for cutting the predicted flitch from the primary workpiece, in which case the first computer system may send the saw sets to the PLC instead of the entire optimized cut solution. The first computer system may also send the 3D model of the primary workpiece and the cut solution to the third computer system 106. For example, the first computer system may associate the optimized cut solution with the corresponding log record in the queue.

At block 307, the third computer system may generate a 3D virtual model of the predicted flitch based at least on the 3D model of the primary workpiece and the cut solution. An example of a corresponding process flow 500 is illustrated in FIG. 7.

Figure 7:
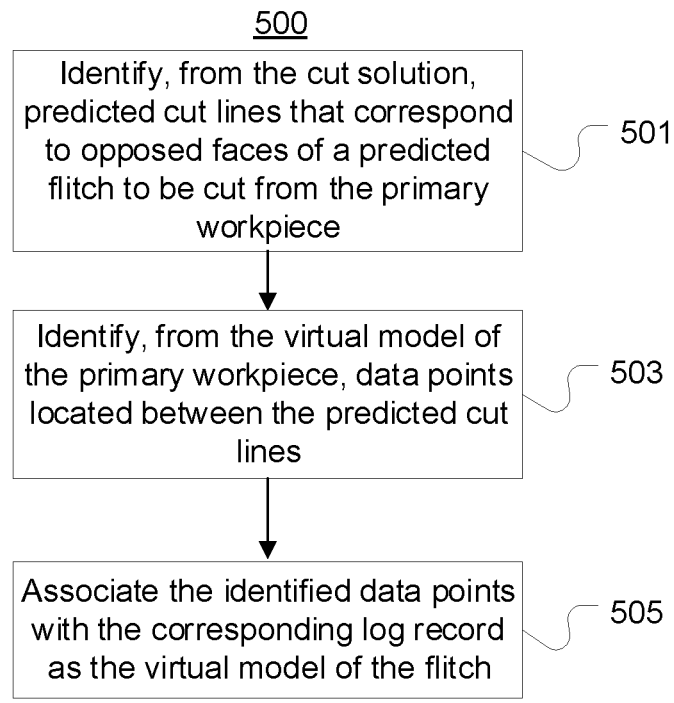
FIG. 7 is a flow diagram of a method of generating a virtual model of a predicted flitch.

Referring now to FIG. 7, at block 501 the third computer system may identify the predicted cut lines that correspond to the predicted flitch. At block 503 the third computer system may identify, from the 3D virtual model of the primary workpiece, the data points located between the two identified cut lines. At block 505, the third computer may associate the identified data points with the corresponding log record as the virtual model of the flitch.

Again, in some embodiments the primary workpiece may be a log. In other embodiments, the primary workpiece may be a cant. Regardless, the virtual model of the predicted flitch may optionally be generated based at least in part on geometric scan data obtained from scanning the log 10, scanning the cant 12 upstream of saws 116, and/or from scanning a remaining center cant 14 downstream of saws 116.

In one embodiment the primary workpiece may be the log, and the virtual model of the predicted flitch may be generated based on the 3D virtual model of the log and the optimized cut solution for the log.

In another embodiment the primary workpiece may be a cant (e.g., cant 12). The cant may be scanned by sensors 102 upstream of the saws 116, a 3D virtual model of the cant may be generated based on that scan data and sent to the third computer, and the third computer may use the virtual model of the cant to generate a virtual model of the predicted flitch (e.g., by identifying the data points located between a chipped face of the cant and the predicted cut line that corresponds to the other face of the predicted flitch to be cut from that side of the cant).

In another embodiment, the primary workpiece may be a log. However, the corresponding cant may be scanned by sensors 102 upstream of the saws 116 and the resulting scan data may be used to modify the 3D virtual model of the log and/or the optimized cut solution. For example, the width of the cant between the chipped faces may be measured by the sensors 102, the first computer system may determine that the measured width is different (e.g., 0.5" greater) than the predicted width, and the first computer system may modify the virtual model of the log and/or cut solution (e.g., the saw set and/or the predicted cut lines relative to the virtual model of the log) to reflect the actual width of the cant. The third computer system may use the modified model/cut solution to generate the model of the predicted flitch. Alternatively, in response to determining the difference in width, the first computer system may determine a corresponding offset to be applied to the 3D virtual model of the log and/or optimized cut solution, and the third computer system may generate the virtual model of the flitch based at least in part on the offset (e.g., by identifying the data points located between an outer face of the cant 12 and the predicted cut line, as offset by the calculated distance). As another example, the third computer system may generate a 3D model of the cant, align the 3D model of the cant with the 3D model of the log, and generate the virtual model of the predicted flitch by identifying the data points between an outer face of the cant and the predicted cut line along which the predicted flitch is to be cut from the cant.

In still other embodiments, the first computer may generate a 3D virtual model of the predicted cant based on a 3D virtual model of the log and the optimized cut solution, and the third computer may generate the virtual model of the predicted flitch based on the 3D virtual model of the predicted cant (e.g., by identifying the data points located between a face of the predicted cant and the predicted cut line along which the predicted flitch is to be cut from that side of the cant).

In yet other embodiments, after the flitch has been cut from the cant by saws 116, the remaining center cant may be scanned by sensors 102 downstream of the saws 116, and the third computer may generate the virtual model of the predicted flitch based at least on that scan data. For example, the third computer system may generate a 3D model of the remaining center cant, align the 3D model of the remaining center cant with the 3D model of the log or cant 12, and generate the virtual model of the predicted flitch by identifying the data points between an outer face of cant 12 and the corresponding outer face of the remaining center cant. Alternatively, the third computer system may determine a difference between the measured width of the cant 12 and/or remaining center cant 16 and the predicted width, determine a corresponding offset (e.g., 0.5" in a particular direction), and identify the data points located between an outer face of the cant 12 and the remaining center cant 16 as offset by the calculated distance.

Referring again to FIG. 5, at block 309 the flitch may be cut from the primary workpiece by saws 116 according to the optimized cut solution.

At block 311 the flitch may be diverted to the secondary breakdown line (e.g., to transport system 108). At block 313, the flitch may be scanned upstream of the edger 130 (i.e., on transport system 108 and/or on edger infeed 122) by sensors 120. Sensors 120 may generate a plurality of dimension coordinates that represent the shape of the actual flitch.

At block 315, the second computer system 126 may generate a 3D virtual model of the actual flitch. An example of a corresponding process flow 600 is illustrated in FIG. 8.

Figure 8:
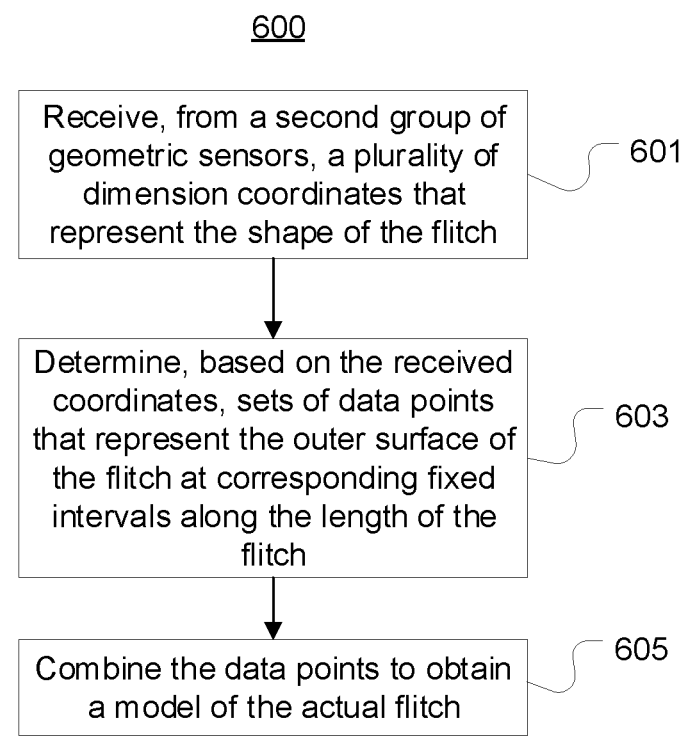
FIG. 8 is a flow diagram of a method of generating a virtual model of an actual flitch.

Referring now to FIG. 8, at block 601 the second computer system 126 may receive the dimension coordinates for the actual flitch from sensors 120. Based on the received coordinates, at block 603 the second computer system may determine sets of data points (x, y coordinates) that represent the outer surface of the actual flitch at corresponding intervals along the length (z-axis) of the flitch. At block 605 the second computer system may send the 3D model of the actual flitch to the third computer 106.

Again, the method or process by which the computer system generates the 3D virtual model of the actual flitch may vary among embodiments. In some embodiments, the 3D model may be generated by the second computer system as an input for determining an optimized cut solution for the flitch.

Referring again to FIG. 5, at block 317 the third computer system 106 may compare the received 3D model of the actual flitch to 3D models of virtual flitches associated with log records in the queue. At block 319, the third computer system may identify the matching 3D virtual model of the predicted flitch based on the comparison. An example of a corresponding process flow 700 for blocks 317-319 is illustrated in FIG. 9.

Figure 9:
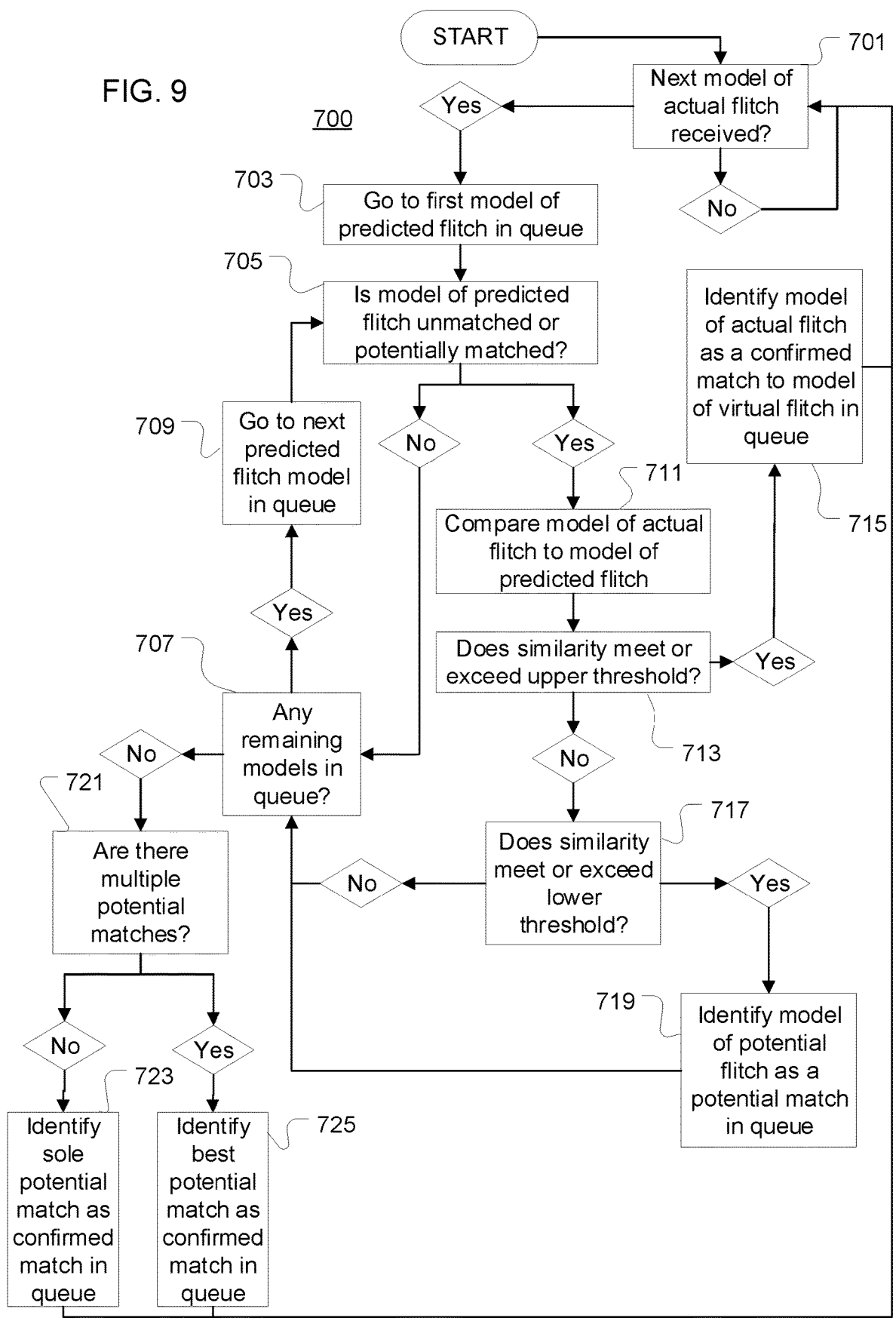
FIG. 9 is a flow diagram of a method of matching virtual models of actual flitches to virtual models of predicted flitches.

Referring now to FIG. 9, at block 701 the third computer system may determine whether a virtual model of an actual flitch has been received. The third computer system may repeat block 503 at regular intervals (e.g., every 5 seconds) until the third computer system determines that a virtual model of an actual flitch has been received.

At block 703, the third computer system may identify a first virtual model of the predicted flitch in the queue. In some embodiments, the queue may be a 'first in, first out' (FIFO) queue, and the third computer system may identify the first model of the predicted flitch as the one associated with the first log record in the queue. In other embodiments, the log records and/or models of predicted flitches may be stored in a ring buffer with the log records/models for a predetermined number of logs, such as approximately the last 50, 100, 150, 200, 250, 300, 350, 400, 450, or 500 or more logs. Optionally, the third computer system may select the first model of the predicted flitch by selecting a log record at random, or by selecting the oldest log record that lacks an indication of a confirmed match, or by selecting the log record based at least in part on one or more characteristics of the primary workpiece and/or cut pattern, such as a length, width, or diameter of the primary workpiece (or portion thereof), or a distance between saws in a saw set, or the like. For example, if the actual flitch is exactly seven feet long, the third computer system may select the virtual model of the predicted flitch that is nearest in length to seven feet. As another example, if the maximum width of the actual flitch is twenty inches, the third computer system may select the virtual model of the predicted flitch with a maximum width nearest to twenty inches. Alternatively, the third computer system may select the first virtual model of a predicted flitch based on a combination of factors (e.g., the oldest log record with an associated model of a predicted flitch that is at least a given length or width, etc.)

At block 705, the third computer system may determine whether the first virtual model of the predicted flitch is unmatched or potentially matched. For example, in some embodiments the third computer system may assume that a virtual model of a predicted flitch is unmatched or potentially matched if a confirmed match is not indicated for that model in the log record. Optionally, a log record may be deleted from the queue once confirmed matches are indicated for all of the associated models of predicted flitches, and the third computer system may assume that each log record still in the queue has at least one associated model that is unmatched or only potentially matched. Alternatively, once confirmed matches are indicated for all of the predicted flitch models associated with a given log record, a corresponding indicator may be added to the log record, and the third computer system may ignore that log record for the purpose of matching models of actual flitches to models of predicted flitches.

Figure 10:
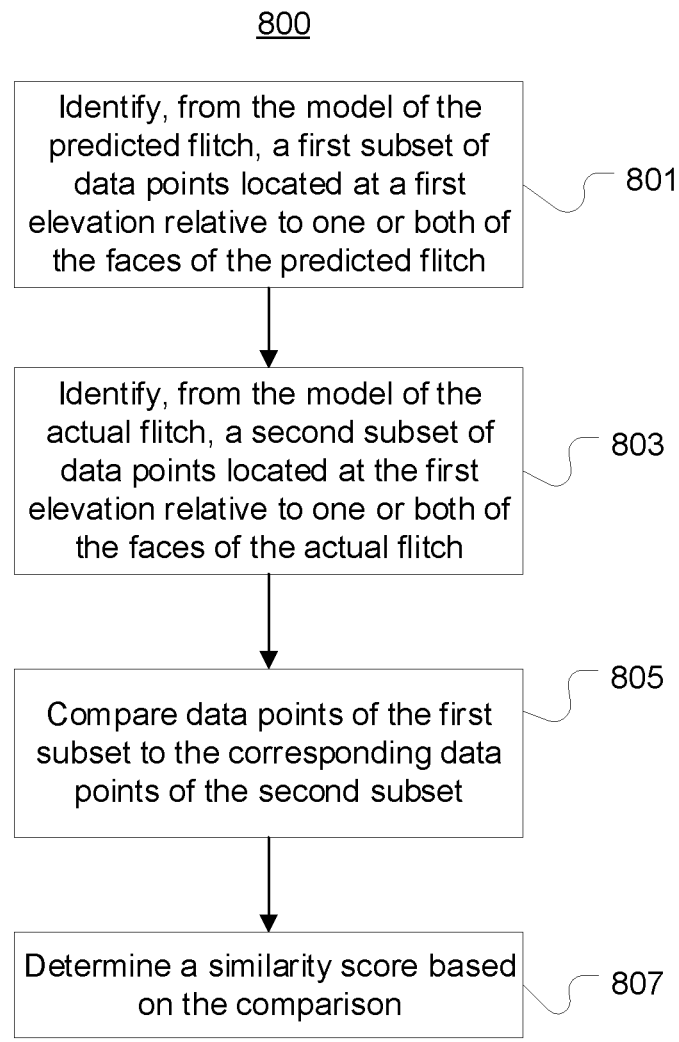
FIG. 10 is a flow diagram of a method of comparing virtual models of actual flitches to virtual models of predicted flitches.

If the third computer system determines that the first virtual model of the predicted flitch is either unmatched or potentially matched, at block 711 the third computer system may compare the model of the actual flitch to the model of the predicted flitch. In some embodiments the third computer system may assess the similarity between the models in numeric terms to generate a similarity score. FIG. 10 illustrates an example of a process flow for comparing the models, discussed in further detail below.

At block 713, the third computer system may determine whether the similarity meets or exceeds a predetermined upper threshold. If the similarity does meet or exceed the threshold, at block 715 the third computer system may identify the model of the actual flitch as a confirmed match to the model of the predicted flitch (e.g., by associating the model of the actual flitch with the corresponding log record in the queue and noting the match in the record as 'confirmed'). The process may then return to block 701.

However, if the similarity does not meet or exceed the threshold, the third computer system may determine whether the similarity meets or exceeds a lower threshold (block 717). If the similarity does meet or exceed the lower threshold, the third computer system may identify the model of the actual flitch as a potential match to the model of the predicted flitch at block 719 (e.g., by associating the model of the actual flitch with the corresponding log record in the queue and noting the match in the record as 'potential'). The process may then proceed to block 707.

Likewise, if the third computer system determines that the model of the predicted flitch is not either unmatched or potentially matched (block 705), or determines that the similarity between the models does not meet or exceed the lower threshold, the third computer system may assume that the model of the actual flitch is not a match to the model of the predicted flitch, and proceed to block 707.

At block 707, the third computer system may determine whether there are any remaining models of predicted flitches in the queue. If there is at least one other model of a predicted flitch in the queue, the process may proceed via block 709 to block 705 again to assess the next model of a predicted flitch.

If there are no other models of predicted flitches in the queue, the first computer system may determine whether multiple potential matches have been identified for the virtual model of the actual flitch. If only one potential match has been identified, at block 723 the third computer system may identify the potential match as a confirmed match in the queue (e.g., by noting the match in the corresponding log record as 'confirmed'), and the process may return to block 701.

If multiple potential matches have been identified for the virtual model of the actual flitch, the third computer system may identify the best potential match and indicate the match as 'confirmed' in the corresponding log record (block 725), and the process may return to block 701. In various embodiments, the third computer system may identify the best match by comparing similarity scores for the matches and selecting the highest similarity score. Optionally, any model(s) of actual flitch(es) associated with a log record but not selected as the best match to any model of a predicted flitch associated with that log record may be deleted from the log record.

The models may be compared by any suitable method. In some embodiments, the 3D virtual models of the predicted/actual flitches may be compared directly to one another. For example, if the log and the actual flitch are modeled as sets of coordinates uniformly spaced apart at the same fixed intervals, the 3D virtual models of the actual and predicted flitches may be compared point-by-point. Alternatively, the 3D virtual models may be processed for comparison to simplify or compress the data using known techniques.

In other embodiments, 2D virtual models of the actual and predicted flitches may be generated based on the 3D virtual models of the actual and predicted flitches (or the 3D virtual models of the actual flitch and the log), and the 2D virtual models (or portions thereof) may be compared to one another. This may enable faster comparison and identification of matches. Optionally, some or all of the 2D virtual models may be 'topographical' models. A topographical model may represent the outer contour of the actual or predicted flitch within a plane that is parallel to, and at a known distance from, one or both of the faces defined in the 3D virtual model.

In various embodiments, a 3D virtual model of a log or flitch may be generated as a set of cross sections at fixed intervals along the length (Z axis) of the log or flitch, with each of the cross sections represented by a corresponding set of data points. The data points may be two-dimensional points (X and Y) that represent the outer surface at that Z location, such that the data points collectively define the shape of the outer surface of the log or flitch. The corresponding 2D topographical model may be the subset of those data points that lie within a reference plane at a known distance from one or both faces (e.g., equidistant between the faces). Optionally, some or all of the data points of the topographical model may be extrapolated or approximated from the data points of the 3D virtual model (e.g., if few or none of the data points of the 3D model are within the desired reference plane). The location of the reference plane relative to the face(s) may be constant, such that each topographical model represents an outer contour at the same elevation. In some embodiments, topographical models may include multiple subsets of data points representing multiple contours at corresponding fixed elevations.

Figure 11:
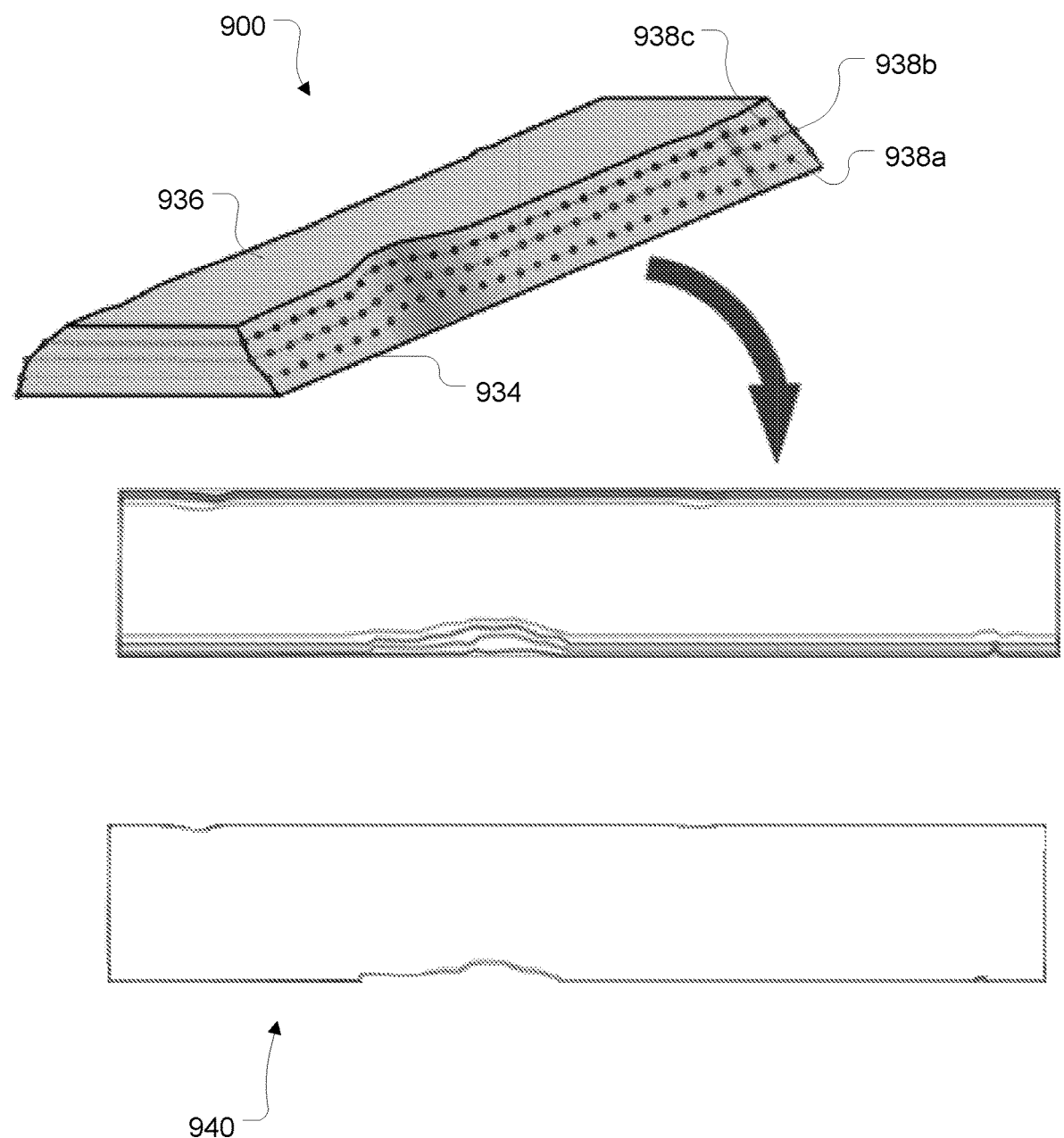
FIG. 11 illustrates an example of a topological virtual model.

FIG. 11 illustrates an example of a 3D virtual model of a flitch, in various embodiments. As illustrated, the 3D virtual model 900 (which may be a model of an actual flitch or a predicted flitch) may define an upper face 936 and a lower face 934 of the flitch. The 3D virtual model 900 may include a plurality of data points that lie within corresponding planes that extend between, and are parallel to, the upper and lower faces. In the illustrated example, data points 938a lie within a first plane nearest to the lower face 934, data points 938b lie within a second plane that is equidistant from the upper and lower faces, and data points 938c lie within a third plane that is nearest to the upper face 936. Thus, in this example, if the reference plane is a plane equidistant from both faces, the second plane may be considered the reference plane and the data points 938b may collectively be considered the 2D topographical model. In plan view, the data points 938b define an outer contour 940 of the flitch at the predetermined elevation (equidistant between the faces). Alternatively, a different elevation/reference plane could be used, and the data points lying within that reference plane could be considered the 2D topographical model. If the 3D virtual model does not include data points within the reference plane, the computer system may extrapolate or approximate a set of data points within the reference plane from some or all of the surrounding data points to generate the 2D model.

Referring now to FIG. 10, which illustrates a comparison and matching method 800, in various embodiments the comparison and matching may be accomplished generally as follows. At block 801 the third computer may identify, from a 3D virtual model of a predicted flitch, a first subset of data points located at a first elevation relative to one or both faces of the predicted flitch. At block 803 the third computer may identify, from a 3D virtual model of an actual flitch, a second subset of data points located at the first elevation relative to one or both faces of the actual flitch. In some embodiments, the identified subsets of data points may be considered 2D models.

Optionally, the first elevation may be the elevation of a reference plane that is halfway between, and parallel to, the faces of the flitch. For example, if a predicted flitch is three inches thick, the data points within a plane that is between the two faces, 1.5 inches from each face, may be identified as the first subset of data points. Likewise, if the actual flitch is 3.5 inches thick, the data points within a plane that is between the two faces, 1.75 inches from each face, may be identified as the second subset of data points. Alternatively, the first elevation may be a fixed elevation relative to one of the faces (e.g., 1 inch from the bottom face, or 0.5 inches from the upper face, etc.). As another alternative, one of the faces may be the reference plane (e.g., an elevation of zero relative to that face). However, using a reference plane located between the planes of the faces may help to reduce or avoid mismatches caused by damage to the wane edge along the lower face and/or inaccurate detection of the wane edge along the upper face.

At block 805, the third computer system may compare data points from the first subset to corresponding data points of the second subset. In some embodiments, the computer system may identify the data points in each subset that correspond to a given z location and compare those data points. For example, each 2D model may have two data points for each z location (one for each wane edge). Because the data points of a subset lie within a single plane (e.g., the plane of x), one of the coordinates (e.g., x) may be the same for each data point of that subset. Thus, for a given z location, the computer system may compare the numeric values of the remaining coordinate (e.g., the y values). Optionally, one of the numeric values may be negative and the other may be positive (e.g., left of centerline is negative and right of centerline is positive, or vice versa) and the computer system may compare negative values to negative values and positive values to positive values. Alternatively, the computer system may sum each pair of data points and compare the sums for that z location.

In some embodiments, comparing the 2D models may involve aligning the models for comparison. The computer system may try to align one model to the other in multiple orientations (e.g., by rotating the model and/or flipping the model vertically or horizontally), either randomly or in a particular order, and select the orientation that provides the best alignment/highest similarity. Alternatively, the computer system may use known orientation factors, such as the orientation of the log along the primary breakdown line (i.e., large end leading, or small end leading) and/or the orientation of the edger and direction of travel of flitches to the edger to determine which edges correspond to one another. For example, if the logs are moved and scanned along the primary breakdown line with the smaller end of the log upstream of the larger end, the first (z) interval of the 3D log models may correspond to the smaller end of the log, and the first (z) interval of the 3D model of the predicted flitch may likewise represent the end of the flitch cut from the smaller end of the log. If the flitches are diverted onto the transport system 118 in the same orientation in which they were cut from the log, and they are scanned in the transverse orientation with the wane side up, the first (z) interval of the 3D model of the actual flitch may be assumed to be at the end of the flitch that corresponds to the small end of the log.

Optionally, after comparing the data points at the first elevation (i.e., comparing the contours of the two models at a single elevation), the third computer system may compare contours at one or more additional elevations. For example, if the contours at the first elevation do not match within a predetermined tolerance, the contour of the actual flitch at the first elevation may be compared to another contour of the predicted flitch at a different elevation, and/or another contour of the actual flitch at a different elevation may be compared to the contour of the predicted flitch at the first elevation or a different elevation. Alternatively, if the contours at the first elevation match within the predetermined tolerance, one or more additional contours may be compared to further assess and/or confirm the match. Although FIG. 11 illustrates three distinct elevations, one of skill in the art will appreciate that any number of elevations may be selected and compared as a part of the matching process. Optionally, a suitable tolerance can be selected by determining a range of variation for known matches (e.g., by aligning contours of actual and predicted flitches known to be matches) and choosing a tolerance that accommodates that range, and optionally one that accommodates a slightly greater range of variation.

In some embodiments, a length offset may be applied in the matching process. This may help to identify matches where the actual flitch is slightly longer or shorter than the predicted flitch, which may occur as the result of inaccurate cutting, damage to the actual flitch upstream of the sensors 120, inaccurate position data from an encoder or other position indicator along the primary breakdown line, or other causes. Therefore, a contour of the predicted flitch at the first elevation may be compared to a contour of the actual flitch at the same elevation, with both contours aligned along the z axis (e.g., by comparing the data points at the first z location of one model to the data points at the first z location of the other model, and so on). If the contours do not match within the predetermined tolerance, the contours may be compared again with one of the contours offset relative to the other along the z axis (e.g., by comparing the data points at the first z location of one model to the data points at the second z location of the other model). Optionally, comparisons may be made in a similar fashion with length offsets in one or both directions up to a predetermined number of distance increments.

In various embodiments, an elevation offset contour alignment may be performed. When the log line is cutting correctly, the best matches are typically identified by comparing contours at the same elevation. However, cutting offset errors may reduce the number of matches identified by that method. Although detecting a reduction in matches may help to detect a cutting offset problem, the reduction in matches may make the determination of a correction factor more challenging. Therefore, a contour of the predicted flitch at the first elevation may be compared to a contour of the actual flitch at the first elevation, and this process may be repeated by comparing one of the contours (e.g., the contour of the actual flitch at the first elevation) to the contours of the other model that are one or more increments above and/or below the first elevation. For example, if the elevations are at intervals of 2/10 of an inch, and the first elevation is at 0.2 inches from the bottom face, the contours of both models at 0.2 inches from the bottom face may be compared, and the contour of one model at 0.2 inches from the bottom face may be compared to contours of the other model at 0.4, 0.6, and 0.8 inches from the bottom face. Alternatively, contours of one model can be compared to contours of the other model offset by an increment of elevation, such as by comparing the predicted contour at an elevation of 0.4 inches to the actual contour at 0.2 inches, comparing the predicted contour at 0.6 inches to the actual contour at 0.4 inches, and comparing the predicted contour at 0.8 inches to the actual contour at 0.6 inches, etc., or vice versa. Optionally, the inverse of this process may also be performed, such as by comparing the actual contour at an elevation of 0.4 inches to the predicted contour at 0.2 inches, comparing the actual contour at 0.6 inches to the predicted contour at 0.4 inches, etc.

Optionally, after aligning a pair of contours, the computer system may apply the offset(s) (if any) to one or more additional contours of the two models and compare the additional contour(s). Alternatively, the computer system may compare only one contour from each model (e.g., by comparing the 2d models).

At block 807, the computer system may determine a similarity score based on the comparison. In some embodiments, the computer system may determine alignment deviation values (e.g., deviation between corresponding data points at each z location) and use the alignment deviation values to determine the similarity score. For example, if the computer system aligns only one contour of the two models (e.g., by aligning the 2D models), the computer system may determine an alignment deviation value at each z location and the similarity score may be the sum of the alignment deviation values. As another example, if the computer system aligns multiple contours of two models, the computer system may determine alignment deviation values at each corresponding elevation, and the similarity score may be the sum of the alignment deviation values and their variance between contours. Alternatively, the computer system may calculate the similarity score by averaging the alignment deviation values, discarding or disregarding any alignment deviation values that are above or below a threshold value, and/or calculate the similarity score in some other manner. Regardless, the computer system may record the similarity score in the corresponding log record. In the event that the alignment of the models/contours included a longitudinal offset and/or elevational offset, the computer system may also record the offset(s) in the corresponding log record.

Optionally, the computer system may be configured to display the comparisons and/or matches via a user interface (e.g., a user interface 128), such as a display. The computer system may also be configured to track the matches as a queue of log solutions.

Figure 14:
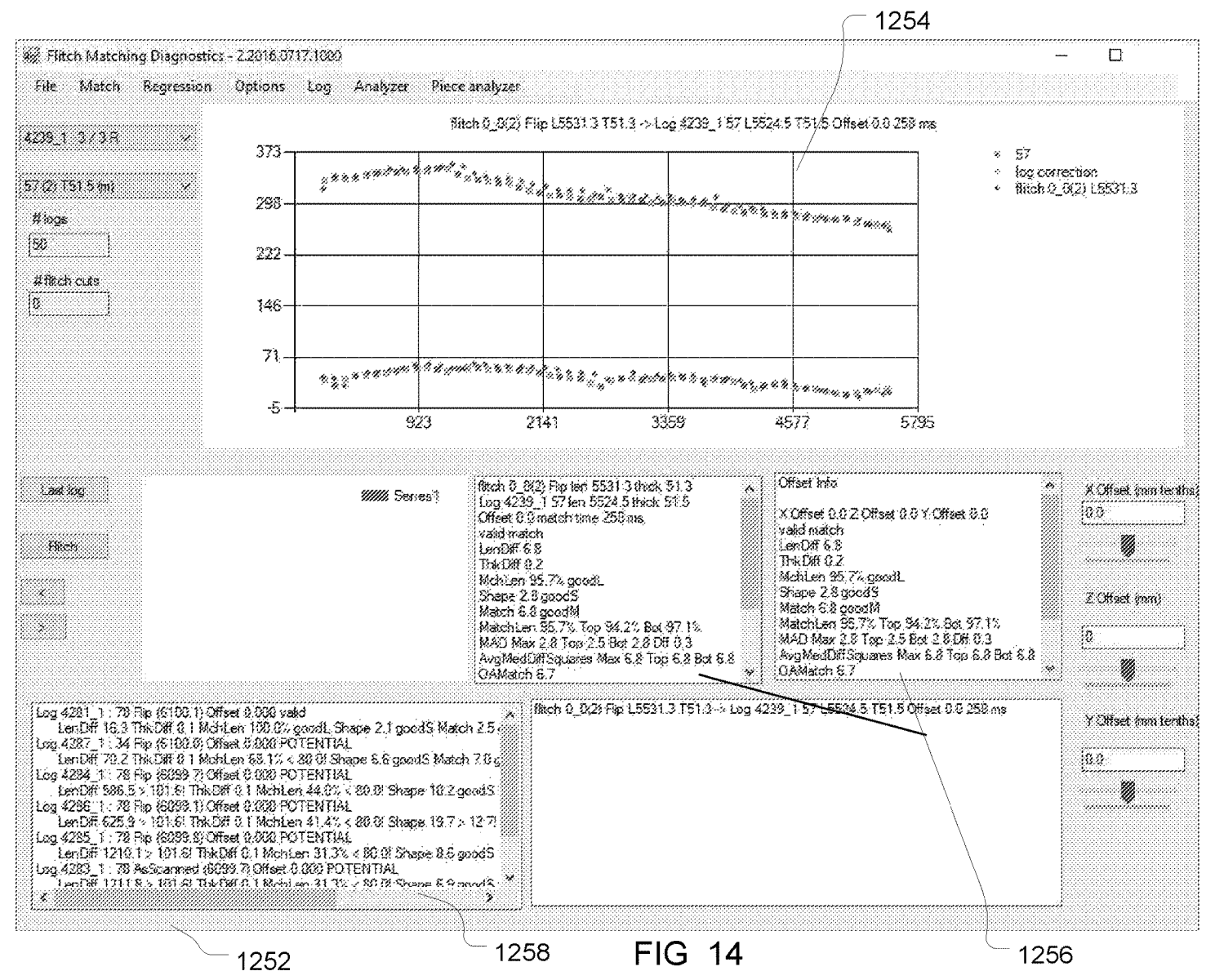

FIG. 14 illustrates an example of a user interface screen 1252 for displaying match results, in accordance with various embodiments. User interface screen 1252 may include an alignment window 1254, one or more match analysis windows 1256, and/or a match ranking window 1258.

The computer system may display a visual representation of a model of a predicted flitch aligned with a model of an actual flitch in the alignment window 1254. In some embodiments the models may be 2D topographical models. As discussed above, the models of the predicted flitches may be associated with corresponding logs in a log queue. For example, in the illustrated alignment window, a 2D topographical model of a predicted flitch (designated as "57") for a particular log ("Log 4239_1") is shown aligned with a 2D topographical model of an actual flitch (designated as "flitch 0_0(2) L5532.3"). Optionally, in some embodiments the model of the actual flitch may be aligned with a corrected model of the predicted flitch (designated in FIG. 14 as "log correction") instead of, or in addition to, the original model of the predicted flitch. For example, cants may be scanned between the chipper and the saws to determine the dimensions and relative locations of the chipped faces, and that data may be used to adjust the corresponding models of the predicted flitches to obtain the corrected models. The use of corrected models of predicted flitches may help to reduce the impact of inaccurate chipping on the speed and accuracy of the matching process, by adjusting for the inaccuracy before the comparison. In other embodiments, corrected models may not be generated, and the computer system may use only the original models of the predicted flitches and the models of the actual flitches for the comparison and matching.

The computer system may display various analysis parameters (e.g., differences in length/thickness, similarity scores, offsets, etc.), and/or indicate the result of the comparison (e.g., as a valid match, a potential match, or no match), in match analysis window(s) 1256. For example, in the illustrated match analysis window on the left, the fourth line of text indicates that the compared models are a valid match. Optionally, the computer system may provide an overall match score. In the illustrated example, the overall match score (designated as "OAMatch") for the model of the predicted flitch 57 is 6.7.

The computer system may display a list of other valid and/or potential matches for that model in match ranking window 1258. Optionally, the other valid/potential matches may be ranked based on the respective overall match scores and/or other analysis parameters. As each comparison is made, the result of the comparison may be added to the list. For example, in the illustration of FIG. 14, if the overall match score of 6.7 for the model of the predicted flitch 57 is higher than the overall match score for the first model on the list, the model of the predicted flitch 57 will be added to the top of the list, and the previous best match will become the second one on the list. If the overall match score for the model of the predicted flitch 57 is lower than the overall match score for the first model on the list, but better than the overall match score for the second model on the list, the model of the predicted flitch 57 will be inserted into the list between the first and second models. The computer system may compare the model of the actual flitch to additional models of predicted flitches and modify the list accordingly.

Figure 15:

In some embodiments, the computer system may display comparison and match results for the predicted cut products (e.g., cants and flitches) of multiple logs in real time. For example, the computer system may display a list of log identifiers for at least some of the logs in the queue, the corresponding cut products, and information about whether each of the corresponding cants and flitches has been matched. Optionally, the computer system may also display an indication of the cutting members (e.g., chip head and saw, or pair of saws) used to cut each of the cants and flitches. FIG. 15 illustrates an example of a corresponding user interface screen 1260. In this figure, logs are identified by number in the left column. The remaining columns correspond to nine zones (Left Zones 1-4, Cant, and Right Zones 4-1), with each zone representing one or more combinations of cutting members. Cut products for each log are indicated in the respective columns. For example, outer flitches/boards cut from the log by the left chipper (LC) and one of the saws (L[saw number]) are listed in Left Zone 1; flitches/boards cut from the log by the first saw (L1) and one of the other saws are listed in Left Zone 2; and so on. As each model of an actual flitch is matched to a model of a predicted flitch, the corresponding entry in the columns is highlighted to indicate the match. Final matches may be differentiated from non-final or potential matches by color or in any other suitable manner. For instance, in FIG. 15, all of the products in Right Zone 1 have been finally matched except for the first and sixth entries on the list (no matches) and the ninth (potential match identified, but not finally matched).

User interfaces can be configured to display comparison and match information in any suitable manner. The arrangement, content, and format of the user interface screen(s) may vary widely among embodiments, and those variations will be readily apparent to those skilled in the art. User interface screens may also be used in some embodiments to display additional information about other parameters, such as product thickness and cutting accuracy, and discussed in further detail below. Referring again to FIG. 5, after matching a model of an actual flitch with a model of a predicted flitch, the third computer system may optionally assess one or more differences (e.g., in thickness, length, width, wane/contour, and/or corresponding zone of source workpiece) between the predicted flitch and the actual flitch (block 321). In some embodiments at block 323 the third computer system may also adjust a saw, generate an alert or error message, or adjust another component of the primary/secondary breakdown line based on the difference(s). The third computer system may also determine which of the saws was used to cut each flitch, either at block 321 or elsewhere in the process flow (e.g., at block 323).

Figure 12:
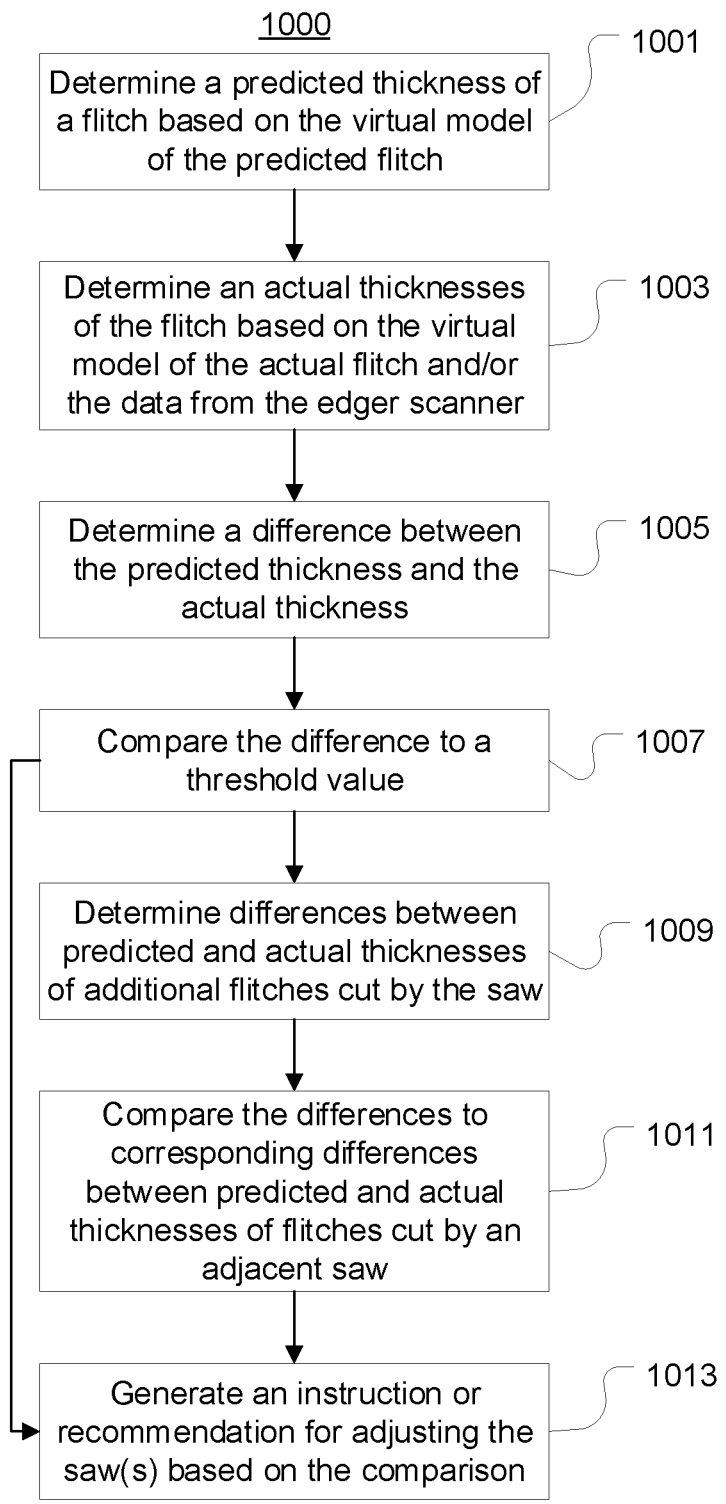
FIG. 12 is a flow diagram of a method of monitoring the performance of a lumber processing system.
Figure 16:
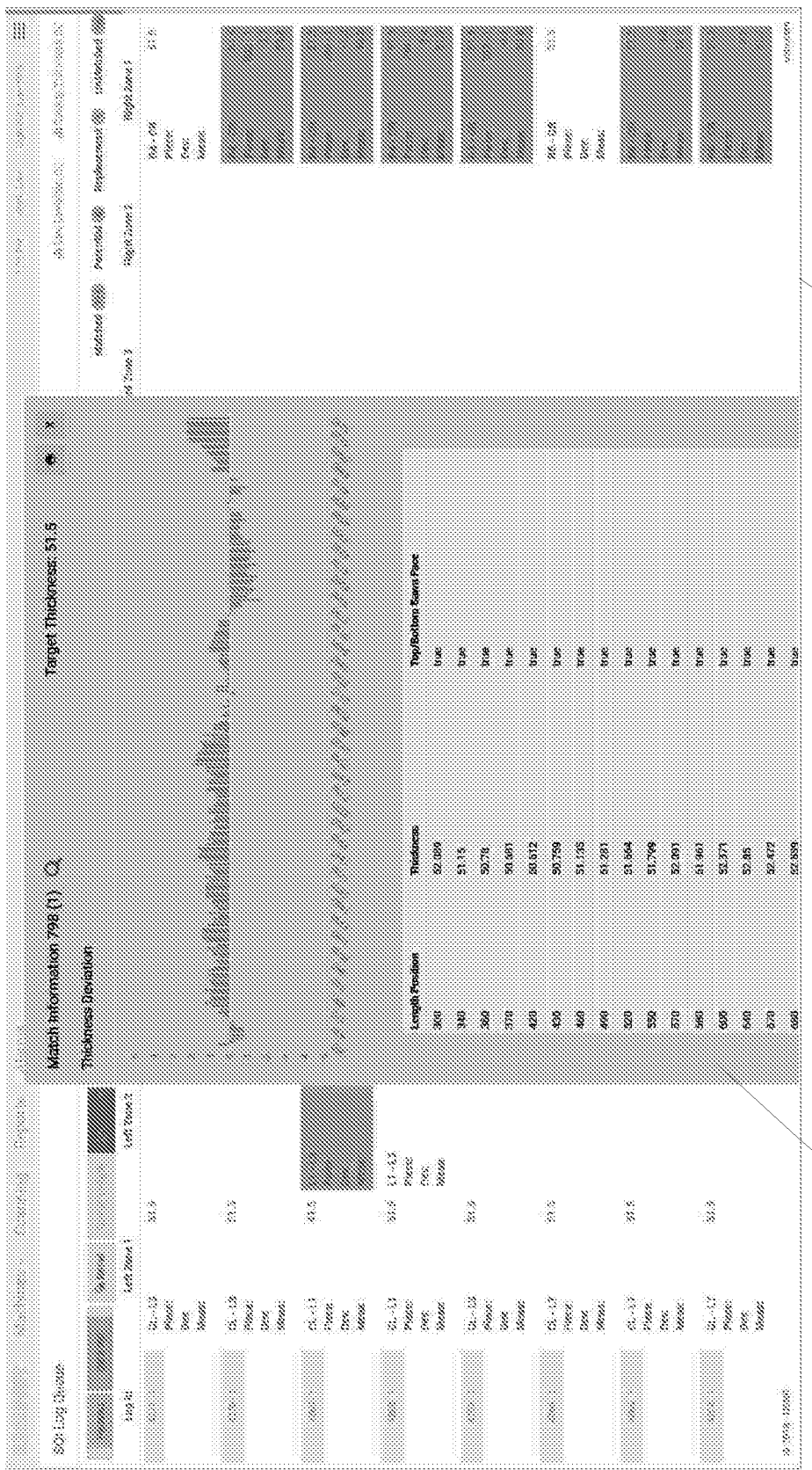
Figure 17:
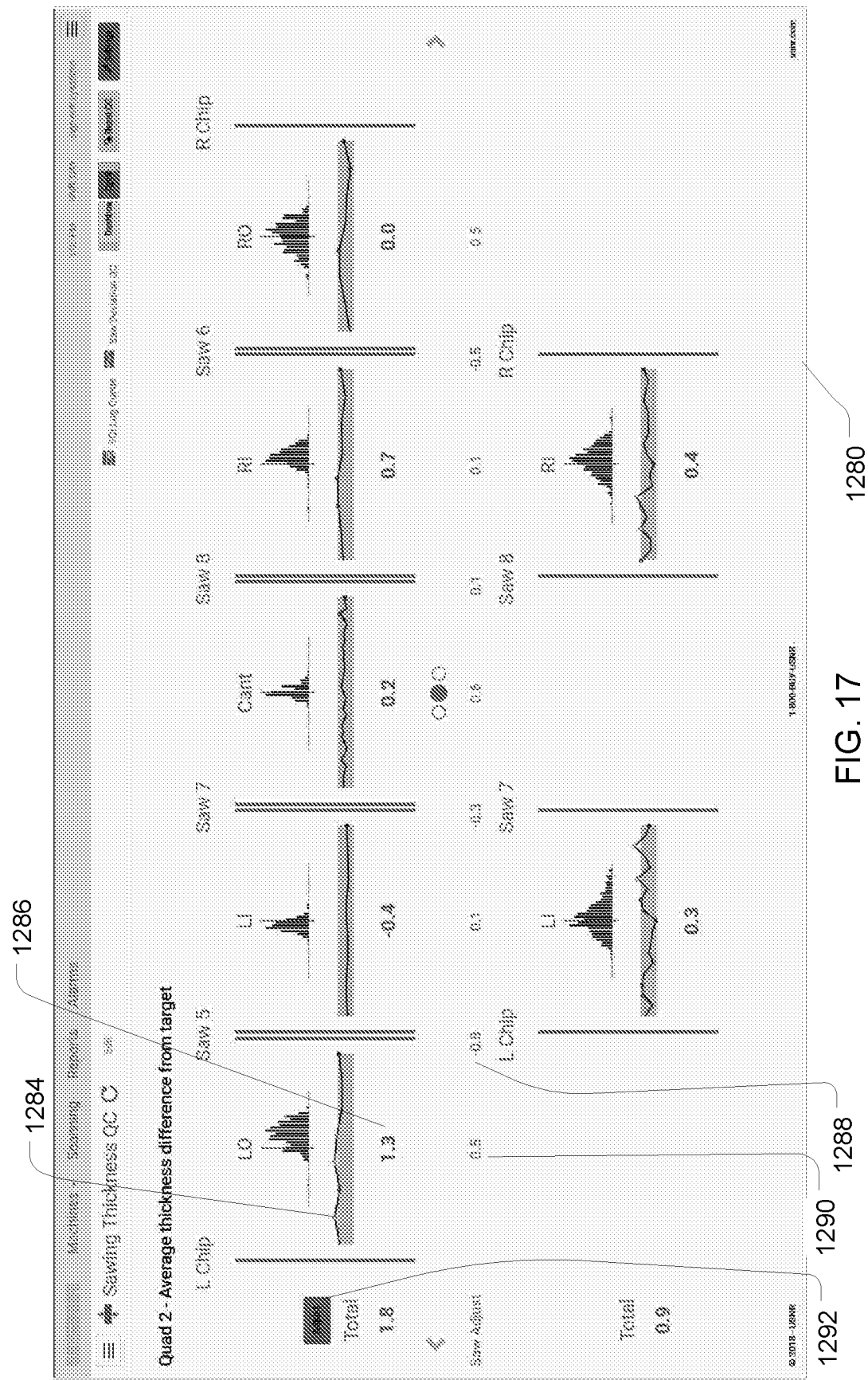

A corresponding process flow 1000 is shown in FIG. 12, and corresponding user interface screens are shown in FIGS. 16-17, in accordance with various embodiments.

At block 1001, the computer system may determine a predicted thickness of a flitch based on the virtual model of the predicted flitch. At block 1003, the computer system may determine an actual thickness of the flitch based on the virtual model of the actual flitch and/or corresponding data from the sensors 120. In some embodiments the computer system may determine the actual thickness at multiple locations along the length of the flitch.

At block 1005, the computer system may determine a difference between the predicted thickness and the actual thickness.

In some embodiments, the computer system may display the predicted and actual thicknesses, and/or the difference between them. FIG. 16 illustrates an example of a corresponding user interface screen 1270. This user interface screen may be a more detailed version of user interface screen 1260, and both screens may have corresponding buttons that allow the user to switch back and forth between the views. In response to user selection of an entry that has been matched, the computer system may display information about the thickness of the actual flitch and the deviation from the predicted/desired thickness in thickness window 1280. In this example, thickness window 1280 indicates the thickness of the actual flitch at increments along the length of the flitch and the deviation of the actual thickness from the desired/predicted thickness ("Target Thickness") at each of those increments.

At block 1007, the computer system may compare the difference to a threshold value. For example, a threshold value may be set based on a range of differences between actual and predicted thicknesses observed within a given time period during which the saws and other equipment are believed to be correctly calibrated and performing as desired.

At block 1009, the computer system may determine differences between predicted and actual thicknesses of additional flitches cut by the same saw. The computer system may also determine differences between predicted and actual thicknesses of flitches cut by other saws, and/or differences between other predicted and actual parameters/characteristics.

At block 1011, the computer system may compare the differences for a given saw with differences for another saw, such as an adjacent saw. At 1013, the computer system may generate an instruction or recommendation for adjusting one or more of the saws, and/or other equipment, based on the comparison. The computer system may also cause the adjustment (e.g., by sending the instruction to a PLC) instead of, or in addition to, generating the recommendation or instruction.

In various embodiments, the computer system may track detected differences between the predicted flitches and actual flitches in combination with other information, such as the saw(s) used to cut the flitches, the order in which the flitches were cut by the particular saw(s), cutting/transport speed, and/or other features or characteristics. For example, if the third computer system determines that successive flitches cut by the outermost right saw are consistently 0.1" thinner than predicted, the third computer system may generate a recommendation to reposition the outermost right saw by 0.1" to offset the positional error, and/or generate and send an instruction to a corresponding PLC to implement that correction. As another example, if the third computer system determines that successive flitches cut by the outermost right saw at a given transport speed are not being cut at a consistent thickness (e.g., thickness varies along the length of the flitch), the third computer system may conclude that the corresponding saw is snaking and generate recommendations for the operator, and/or generate and send instructions to the PLC, to adjust the saw tension and/or perform other maintenance/repair on the saw. In contract, if the third computer system determines that flitches cut by multiple saws at an increased speed are not being cut at a constant thickness, the third computer system may generate recommendations for the operator and/or generate and send instructions to the PLC, to reduce the speed of the corresponding workpiece transport.

In some embodiments, the scanner optimizer system includes sensors positioned to scan the cant upstream of saws 116 and/or the remaining center cant downstream of saws 116, and the third computer system may use the corresponding scan data in combination with other data to monitor operational parameters of the primary breakdown line. The scanner optimizer system may compare predicted and actual characteristics of cant 14 and/or cant 16 such as left face size, left face offset, right face size, right face offset, cant centerline, cant width, and/or cant skew. For example, if the scanner optimizer system determines that the size of the left face of successive cants 14 is consistently larger or smaller than predicted, or is consistently offset by 0.2" from the expected position, the scanner optimizer system may conclude that the logs are not being positioned correctly upstream of the chipper (e.g., if the actual cant width matches the predicted width), or that the left chip head is not being positioned correctly to chip the left side of the logs (e.g., if the actual cant width does not match the predicted cant width).

In some embodiments, the computer system (e.g., third computer system and/or scanner optimizer system) may display thickness deviations, recommendations for adjusting the chippers/saws, and/or other parameters. For example, the computer system may track the thickness (or thickness deviations) of the cants and flitches over time, display visual representations of the thickness deviations relative to the corresponding cutting members (e.g., chippers and saws), and display recommended adjustments to each of the cutting members. Optionally, the computer system may display a user-selectable button or other such feature that causes the computer system to implement the recommended adjustment(s). FIG. 17 illustrates an example of a corresponding user interface screen 1280. This user interface screen indicates the left chipper ("L Chip"), right chipper ("R Chip"), and four saws (5-9) downstream of the chipper, which collectively are used to cut a left outer flitch (LO), a left inner flitch (LI), center cant (cant), right inner flitch (RI), and right outer flitch (RO), from a log. In this example, for each of the products, the computer system displays a representation of the thickness deviations 1284 and an average thickness deviation 1286, and for each of the cutting members the computer system displays a recommended adjustment 1288 and a predicted average thickness deviation 1290 (the average thickness deviation predicted for the cutting member if the recommended adjustment were implemented). The user interface screen may also have a button 1292 that is selectable by the user to cause the computer system to implement the recommended adjustment(s).

Although the present disclosure describes a scanner optimizer system with three computer systems performing corresponding operations, those with ordinary skill in the art will readily appreciate that the operations may instead be performed by a single computer system, or distributed in other ways among multiple computer systems. For example, in some embodiments the first and second computer systems may generate 2D models of the predicted and actual flitches, respectively, or the first or second computer system may generate the 2D models. Likewise, in some embodiments the first computer system may include multiple computers, and the operations of the first computer system may be distributed among the computers (e.g., one computer generates the 3D model of the log, another computer determines the optimized rotational position, and a third computer determines the optimized cut solution). Still other embodiments may have only one computer system that performs all of the operations attributed herein to the first, second, and third computer systems. In some embodiments a computer system and some of the corresponding sensors may be integrated within a common housing, or may be separate components operatively connected.

Figure 13:
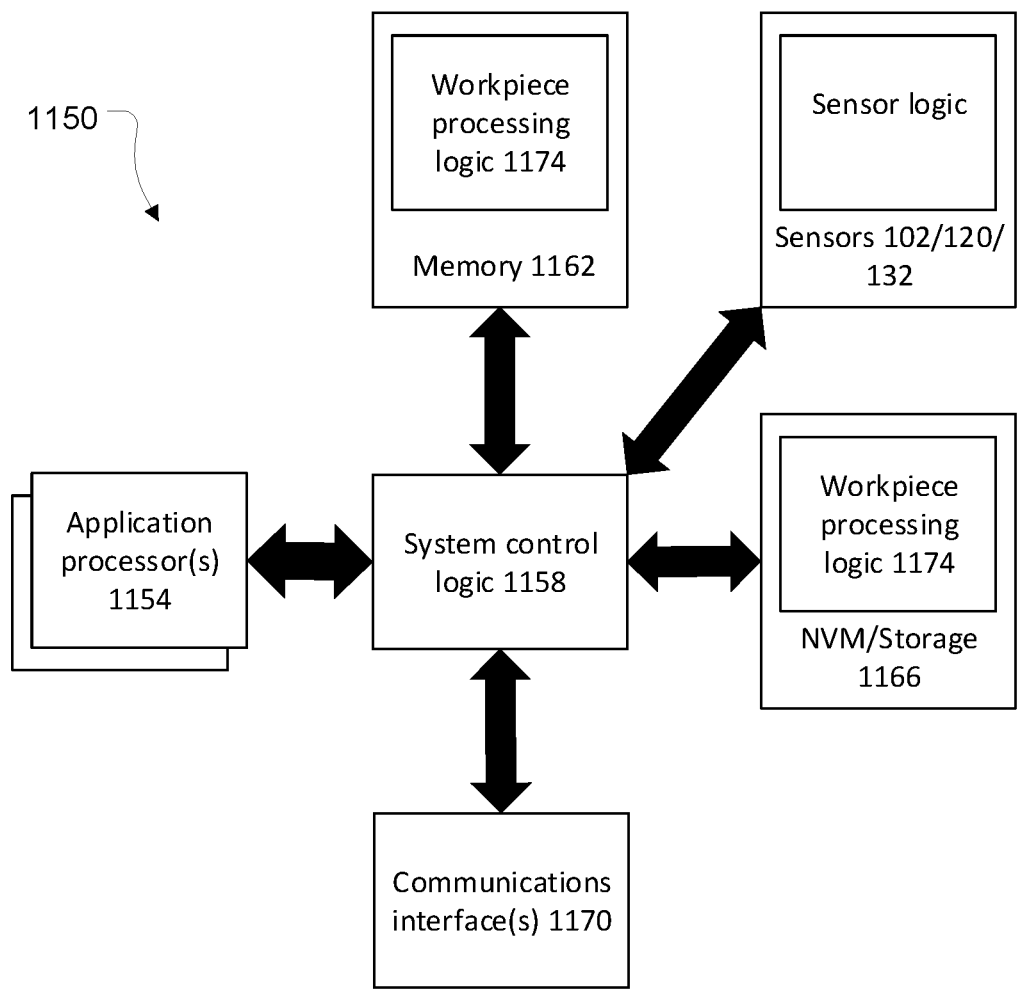
FIG. 13 illustrates an example of a computer system suitable for practicing embodiments of the present disclosure.

FIG. 13 illustrates an example of a computer system 1150 suitable for performing some or all of the operations/methods described herein, in accordance with various embodiments. Computer system 1150 may have some or all of the features described herein with regard to various computer systems (e.g., first computer system 104, second computer system 126, and/or third computer system 106).

As illustrated, computer system 1150 may include system control logic 1158 coupled to at least one of the processor(s) 1154, memory 1162 coupled to system control logic 1158, non-volatile memory (NVM)/storage 1166 coupled to system control logic 1158, and one or more communications interface(s) 1170 coupled to system control logic 1158. In various embodiments, system control logic 1158 may be operatively coupled with sensors (e.g., sensors 102, 120, and/or 132) and/or an output device (e.g., user interfaces 128*a-d*). In various embodiments the processor(s) 1154 may be a processor core.

System control logic 1158 may include any suitable interface controller(s) to provide for any suitable interface to at least one of the processor(s) 1154 and/or any suitable device or component in communication with system control logic 1158. System control logic 1158 may also interoperate with the sensors and/or the output device(s). In various embodiments, the output device may include a display.

System control logic 1158 may include one or more memory controller(s) to provide an interface to memory 1162. Memory 1162 may be used to load and store data and/or instructions, for example, for various operations of lumber processing system 100. In one embodiment, system memory 1162 may include any suitable volatile memory, such as suitable dynamic random access memory ("DRAM").

System control logic 1158, in one embodiment, may include one or more input/output ("I/O") controller(s) to provide an interface to NVM/storage 1166 and communications interface(s) 1170.

NVM/storage 1166 may be used to store data and/or instructions, for example. NVM/storage 1166 may include any suitable non-volatile memory, such as flash memory, for example, and/or any suitable non-volatile storage device(s), such as one or more hard disk drive(s) ("HDD(s)"), one or more solid-state drive(s), one or more compact disc ("CD") drive(s), and/or one or more digital versatile disc ("DVD") drive(s), for example.

The NVM/storage 1166 may include a storage resource that may physically be a part of a device on which computer system 1150 is installed, or it may be accessible by, but not necessarily a part of, the device. For example, the NVM/storage 1166 may be accessed over a network via the communications interface(s) 1170.

System memory 1162, NVM/storage 1166, and/or system control logic 1158 may include, in particular, temporal and persistent copies of workpiece processing logic 1174. The workpiece processing logic 1174 may include instructions operable, upon execution by at least one of the processor(s) 1154, to cause computer system 1150 to practice one or more aspects of operations described herein (e.g., creation of a 3D virtual model of a log, cant, and/or flitch based on sensor data, calculation of a cut solution, creation of a 3D virtual model of a predicted flitch, creation of 2D virtual models of predicted and actual flitches, comparison of virtual models, identifying a source log/cant based on the comparison, monitoring and analyzing performance of saws and other equipment, adjusting positions or operations of saws and other equipment, displaying comparison and match information/results, displaying performance analysis information/results, etc.)

Communications interface(s) 1170 may provide an interface for computer system 1150 to communicate over one or more network(s) and/or with any other suitable device. Communications interface(s) 1170 may include any suitable hardware and/or firmware, such as a network adapter, one or more antennas, a wireless interface, and so forth. In various embodiments, communication interface(s) 1170 may include an interface for computer system 1150 to use NFC, optical communications (e.g., barcodes), BlueTooth or other similar technologies to communicate directly (e.g., without an intermediary) with another device. In various embodiments, the wireless interface may interoperate with radio communications technologies such as, for example, WCDMA, GSM, LTE, and the like.

The capabilities and/or performance characteristics of processors 1154, memory 1162, and so forth may vary. In various embodiments, computer system 1150 may include, but is not limited to, a smart phone, a computing tablet, a laptop computer, a desktop computer, and/or a server. In various embodiments computer system 1150 may be, but is not limited to, one or more servers known in the art.

In one embodiment, at least one of the processor(s) 1154 may be packaged together with system control logic 1158 and/or workpiece processing logic 1174. For example, at least one of the processor(s) 1154 may be packaged together with system control logic 1158 and/or workpiece processing logic 1174 to form a System in Package ("SiP"). In another embodiment, at least one of the processor(s) 1154 may be integrated on the same die with system control logic 1158 and/or workpiece processing logic. For example, at least one of the processor(s) 1154 may be integrated on the same die with system control logic 1158 and/or workpiece processing logic to form a System on Chip ("SoC").

The computer system may be configured to perform any or all of the calculations, operations, and/or functions described above and/or in FIGS. 5-10 and 12.

Thus, in various embodiments, a virtual model of a predicted flitch may be aligned with virtual models of actual flitches to identify a source workpiece, such as a log or a cant, from which the actual flitch was cut, as well as the corresponding zone of the source workpiece. This may enable identification of the saw(s) used to cut the flitch from the primary workpiece, allowing the operator to detect and address a misalignment or operational error of the saw(s) or other equipment. In addition, identifying the source workpiece may enable identification of the species of each flitch upstream of the edger, which may allow the operator and/or computer system to determine or adjust a cut solution for the flitch based at least in part on the wood species.

Although certain embodiments have been illustrated and described herein, it will be appreciated by those of ordinary skill in the art that a wide variety of alternate and/or equivalent embodiments or implementations calculated to achieve the same purposes may be substituted for the embodiments shown and described without departing from the scope. Those with skill in the art will readily appreciate that embodiments may be implemented in a very wide variety of ways. This application is intended to cover any adaptations or variations of the embodiments discussed herein. Therefore, it is manifestly intended that embodiments be limited only by the claims and the equivalents thereof.

What is claimed is:

1. A non-transitory computer-readable medium comprising instructions operable, upon execution by a processor of a computer, to cause the computer to:
   generate, based at least on a 3D virtual model of a primary workpiece and a cut solution for the primary workpiece, a 3D virtual model of a predicted flitch,
   determine, based at least on the 3D virtual model of the predicted flitch, a first group of data points that represent an outer contour of the predicted flitch at a first elevation relative to a first face of the predicted flitch,
   determine, based at least on a 3D virtual model of the actual flitch, a second group of data points that represent an outer contour of the actual flitch at said first elevation relative to a corresponding first face of the actual flitch,
   compare the data points of the first group to corresponding ones of the data points of the second group to thereby compare the 3D virtual model of the actual flitch to the 3D virtual model of the predicted flitch, and
   based on the comparison, identify the primary workpiece as the source of the actual flitch.

2. The non-transitory computer-readable medium of claim 1, the instructions are further operable, upon execution by the processor, to cause the computer to:
   send instructions to a controller or a display based at least in part on the comparison, wherein the instructions are configured to
      cause the controller to adjust a cutting device or a workpiece transport, or
      cause the display to display a result of the comparison, a recommendation to adjust the cutting device, a recommendation to perform maintenance or repair on the cutting device, or a recommendation to adjust a speed of the workpiece transport.

3. The non-transitory computer-readable medium of claim 2, wherein the primary workpiece is a log.

4. The non-transitory computer-readable medium of claim 2, wherein the primary workpiece is a cant.

5. The non-transitory computer-readable medium of claim 1, wherein the first elevation is an elevation equidistant between the first face and an opposite second face of one of said flitches.

6. The non-transitory computer-readable medium of claim 1, wherein the instructions are further operable, upon execution by the processor, to cause the computer to,
   generate, based at least on a 3D virtual model of a second primary workpiece and a cut solution for the second primary workpiece, a second 3D virtual model of a second predicted flitch,
   compare the 3D virtual model of the actual flitch to the second 3D virtual model of the second predicted flitch, and
   based on the comparison, eliminate the second primary workpiece as the source of the actual flitch.

7. A system for identifying a primary workpiece as a source of a flitch, the system comprising:
   a first scanner optimizer system including a plurality of first sensors operatively coupled with a first computer system, wherein the first sensors are collectively positioned to scan a primary workpiece along a first path of flow and operable to measure a geometric profile of the primary workpiece, and the first computer system is configured to generate a 3D virtual model of the primary workpiece and a cut solution for the primary workpiece based at least on data from the first sensors;

a second scanner optimizer system including a plurality of second sensors operatively coupled with a second computer system, wherein the second sensors are collectively positioned to scan a flitch along a second path of flow and operable to measure a geometric profile of the flitch, and the second computer system is configured to generate a 3D virtual model of the flitch based at least on data from the second sensors; and a third computer system operatively coupled with the first and second computer systems and programmed with instructions operable, upon execution by one or more processors, to cause the third computer system to generate a 3D virtual model of a predicted flitch based at least on the 3D virtual model of the primary workpiece and the cut solution, determine, based at least on the 3D virtual model of the predicted flitch, a first group of data points that represent the outer contour of the predicted flitch at a first elevation relative to a first face of the predicted flitch, determine, based at least on the 3D virtual model of the predicted flitch, a second group of data points that represent the outer contour of the actual flitch at the first elevation relative to a corresponding first face of the actual flitch, compare the first group of data points to the second group of data points to thereby compare the 3D virtual model of the actual flitch to the 3D virtual model of the predicted flitch, and based on the comparison, identify the primary workpieces as the source of the actual flitch.

8. The system of claim 7, wherein the instructions are further operable, upon execution by the one or more processors, to cause the third computer system to send instructions to a controller or a display based at east in part on the comparison, wherein the instructions are configured to cause the controller to adjust a cutting device or a workpiece transport, or cause the display to display a result of the comparison, a recommendation to adjust the cutting device, a recommendation to perform maintenance or repair on the cutting device, or a recommendation to adjust a speed of the workpiece transport.

9. A method of matching a flitch to a source log, the method comprising:

detecting a geometric profile of a primary workpiece with a first plurality of sensors;

generating a 3D virtual model of the primary workpiece and a cut solution for the primary workpiece based at least on the detected geometric profile of the primary workpiece;

generating a 3D virtual model of a predicted flitch based at least on the 3D virtual model of the primary workpiece and the cut solution;

detecting a geometric profile of an actual flitch;

generating a 3D virtual model of the actual flitch based at least on the detected geometric profile of the actual flitch;

determining a first outer contour of the predicted flitch at a first elevation relative to a first face of the predicted flitch, determining a second outer contour of the actual flitch at said first elevation relative to a corresponding first face of the actual flitch, comparing the first cuter contour to the second outer contour to thereby compare the 3D virtual model of the predicted flitch to the 3D virtual model of the actual flitch; and based on the comparison, identifying the primary workpiece as the source of the actual flitch.

10. The method of claim 9, wherein determining the first outer contour includes generating a first 2D model of the outer shape of the 3D virtual model of the predicted flitch at the first elevation determining the second outer contour includes generating a second 2D model of the outer shape of the 3D virtual model of the actual flitch at the first elevation, and comparing the first outer contour to the second outer contour includes comparing the first 2D model to the second 2D model.

11. The method of claim 9, wherein the first outer contour is represented by a group of first coordinates at intervals along a length of the predicted flitch, and the second outer contour is represented by a group of second coordinates at intervals along a length of the actual flitch, and wherein comparing the first outer contour to the second outer contour includes comparing the first coordinates to corresponding ones of the second coordinates.

12. The method of claim 9, further comprising identifying a zone within the primary workpiece as the zone from which the flitch was cut, based at least in part on the cut solution.

13. The method of claim 12, further comprising identifying, based at least on the identified zone or the cut solution, a saw that was used to cut the flitch from the primary workpiece.

14. The method of claim 13, further comprising:

determining one or more geometric differences between the predicted flitch and the flitch, and adjusting a position of said saw based at least on the one or more geometric differences.

15. A method of modifying a log processing system, wherein the log processing system includes a first scanner optimizer system and a second scanner optimizer system, the method comprising:

operatively coupling a computer system with the first and second scanner optimizers, wherein the computer system is programmed with instructions operable, upon execution by one or more processors of the computer system, to cause the computer system to:

receive a virtual model of a primary workpiece and a cut solution for the primary workpiece from the first scanner optimizer system, generate a virtual model of a predicted flitch based at least on the virtual model of the primary workpiece and the cut solution;

receive a virtual model of an actual flitch from the second scanner optimizer system;

compare an outer contour of the predicted flitch at a first elevation relative to a first face of the predicted flitch to an outer contour of the actual flitch at a corresponding elevation relative to a corresponding face of the actual flitch to thereby compare the virtual model of the predicted flitch to the virtual model of the actual flitch; and identify the primary workpiece as the source of the flitch based at least on the comparison.

16. The method of claim 15, wherein the instructions are operable, upon execution by the one or more processors, to cause the computer system to:

second instruction to a controller or a display based at least in part on the comparison, wherein the instructions are configured to cause the controller to adjust a cutting device or a workpiece transport, or cause the display to display a result of the comparison, a recommendation to adjust the cutting device, a recommendation to perform maintenance or repair on the cutting device, or a recommendation to adjust a speed of the workpiece transport.

17. The method of claim 15, wherein each of the outer contours is represented by a respective plurality of coordinates that represent the outer shape of the respective one of the virtual models within a respective plane at said first elevation, each of the coordinates having a corresponding locations along a longitudinal axis, and wherein the instructions are operable, upon execution by the one or more processors, to cause the computer system to compare the outer contours by comparing the coordinates of the outer contours at respective ones of the locations along the longitudinal axis.

18. The method of claim 17, wherein the first elevation does not coincide with the first face or an opposite second face of the predicted flitch or the actual flitch.

19. The method of claim 15, wherein the instructions are operable, upon execution by the one or more processors, to cause the computer system to identify a saw used to cut the actual flitch, based at least on the cut pattern.

20. The method of claim 19, wherein the instructions are operable, upon execution by the one or more processors, to cause the computer system to:

determine a first geometric difference between the actual flitch and the predicted flitch, and based on the first geometric difference, adjust a position of the saw.

21. The method of claim 15, wherein the instructions are further operable, upon execution by the one or more processors, to cause the computer system to:

compare a virtual model of a second predicted flitch to the virtual model of the actual flitch; and identify the virtual model of the second predicted flitch as a potential match to the virtual model of the actual flitch based on the comparison.

* * * * *